(12) United States Patent
Wu

(10) Patent No.: US 8,153,958 B2
(45) Date of Patent: Apr. 10, 2012

(54) METHOD AND APPARATUS FOR PRODUCING HYPERTHERMAL BEAMS

(75) Inventor: Mark Yi-Shuen Wu, Arcadia, CA (US)

(73) Assignee: Sphere Renewable Energy Corp., Las Vegas, NV (US)

( * ) Notice: Subject to any disclaimer, the term of this patent is extended or adjusted under 35 U.S.C. 154(b) by 325 days.

(21) Appl. No.: 12/501,315

(22) Filed: Jul. 10, 2009

(65) Prior Publication Data

US 2011/0006227 A1    Jan. 13, 2011

(51) Int. Cl.
H05H 3/02    (2006.01)
H05H 3/00    (2006.01)

(52) U.S. Cl. .................................... 250/251; 250/503.1
(58) Field of Classification Search .................. 250/251
See application file for complete search history.

(56) References Cited

U.S. PATENT DOCUMENTS

| | | | |
|---|---|---|---|
| 4,088,966 A | | 5/1978 | Samis |
| 5,519,213 A | * | 5/1996 | Hatakeyama ................. 250/251 |
| 5,640,843 A | | 6/1997 | Aston |
| 5,883,005 A | | 3/1999 | Minton et al. |
| 5,883,470 A | * | 3/1999 | Hatakeyama et al. ... 315/111.51 |
| 2003/0164285 A1 | | 9/2003 | Korenev |
| 2003/0165617 A1 | | 9/2003 | Kagadei et al. |
| 2003/0168011 A1 | | 9/2003 | Lee et al. |
| 2003/0234354 A1 | | 12/2003 | Hess et al. |
| 2007/0235339 A1 | * | 10/2007 | Smith et al. ................... 204/632 |
| 2010/0252537 A1 | * | 10/2010 | Li et al. ....................... 219/121.5 |

OTHER PUBLICATIONS

Way et al., 'Arc-heated high-intensity source of hydrogen atoms', May 6, 1976, Review of Scientific Instruments, vol. 47, No. 9, p. 1049-1055.*

Young et al., 'An Arc Heater for Supersonic Molecular Beams', Jan. 27, 1969, Review of Scientific Instruments, vol. 40, p. 1346-1347.*
Samano et al., 'An arc discharge hydrogen atom source', Oct. 30, 1992, Review of Scientific Instruments, vol. 64, No. 10, p. 2746-2752.*
Abuaf, et al., "Molecular Beams with Energies above one Electron Volt", Science, Feb. 24, 1967, pp. 997-999, vol. 155, No. 3765, American Association for the Advancement of Science.
Herschbach, "Reactive Collisions in Crossed Molecular Beams", Disc. Far. Soc., 1962, pp. 149-161, vol. 33.
Kessler, et al., "Production of Fast Molecular Beams Using Supersonic Plasma Jet", Rev. Sci. Instr., 1966, p. 682, vol. 37.
Skinner, "Molecular Beam for the Study of High-Temperature-Gas Collision Processes", The Physics of Fluids, Sep. 1961, pp. 1172-1176, vol. 4, No. 9. Toennies, et al., "Observation of orbiting resonances in the integral cross section of H-Xe", The Journal of Chemical Physics, Sep. 15, 1974, pp. 2461-2462, vol. 61, No. 6, American Institute of Physics.

* cited by examiner

Primary Examiner — Jack Berman
Assistant Examiner — Eliza Osenbaugh-Stewart
(74) Attorney, Agent, or Firm — McDermott Will & Emery LLP; Soyeon (Karen) Pak Laub

(57) ABSTRACT

An exemplary apparatus and method for producing a hyperthermal beam is provided. An apparatus may comprise a plasma discharge source, an emission system, and a magnetic source. The plasma discharge source may be configured to receive an elemental source, generate plasma based on the elemental source, and generate one or more neutral atoms of the elemental source. The emission system may be configured to emit a hyperthermal beam, comprising the one or more neutral atoms of the elemental source, from the plasma discharge source through an aperture of the plasma discharge source. The magnetic source may be configured to provide a magnetic field and to collimate the hyperthermal beam in a first direction and control a size of the hyperthermal beam.

29 Claims, 14 Drawing Sheets

METHOD AND APPARATUS FOR PRODUCING HYPERTHERMAL BEAMS

STATEMENT REGARDING FEDERALLY SPONSORED RESEARCH OR DEVELOPMENT

Not Applicable.

FIELD

The present invention generally relates to hyperthermal beams and, in particular, relates to methods and apparatuses for producing hyperthermal beams.

BACKGROUND

Plasma is generally a partially ionized gas of low density, containing approximately equal numbers of positive and negative ions. The ability of the positive and negative charges to move somewhat independently makes the plasma electrically conductive. Plasma therefore has properties quite unlike those of solids, liquids or gases and is considered to be a distinct state of matter. Plasma typically takes the form of gas-like clouds. Plasma may be used in various applications such as for producing various types of atomic beams.

SUMMARY

In accordance with various aspects of the subject disclosure, an apparatus for producing a hyperthermal beam is provided. The apparatus may comprise a plasma discharge source, an emission system, and a magnetic source. The plasma discharge source may be configured to receive an elemental source, generate plasma based on the elemental source, and generate one or more neutral atoms of the elemental source. The emission system may be configured to emit a hyperthermal beam, comprising the one or more neutral atoms of the elemental source, from the plasma discharge source through an aperture of the plasma discharge source. The magnetic source may be configured to provide a magnetic field and to collimate the hyperthermal beam in a first direction and control a size of the hyperthermal beam.

According to various aspects of the subject disclosure, a method for producing a hyperthermal beam is provided. The method may comprise receiving an elemental source and generating plasma based on the elemental source. The method may also comprise providing a magnetic field and generating one or more neutral atoms of the elemental source. The method may also comprise emitting a hyperthermal beam, comprising the one or more neutral atoms of the elemental source, collimated in a first direction and having a controlled size.

In accordance various aspects of the subject disclosure, an apparatus for producing a hyperthermal beam is provided. The apparatus may comprise means for receiving an elemental source and means for generating plasma based on the elemental source. The apparatus may also comprise means for providing a magnetic field and means for generating one or more neutral atoms of the elemental source. The apparatus may also comprise means for emitting a hyperthermal beam, comprising the one or more neutral atoms of the elemental source, collimated in a first direction and having a controlled size.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate aspects of the invention and together with the description serve to explain the principles of the invention.

DETAILED DESCRIPTION

Figure 1:
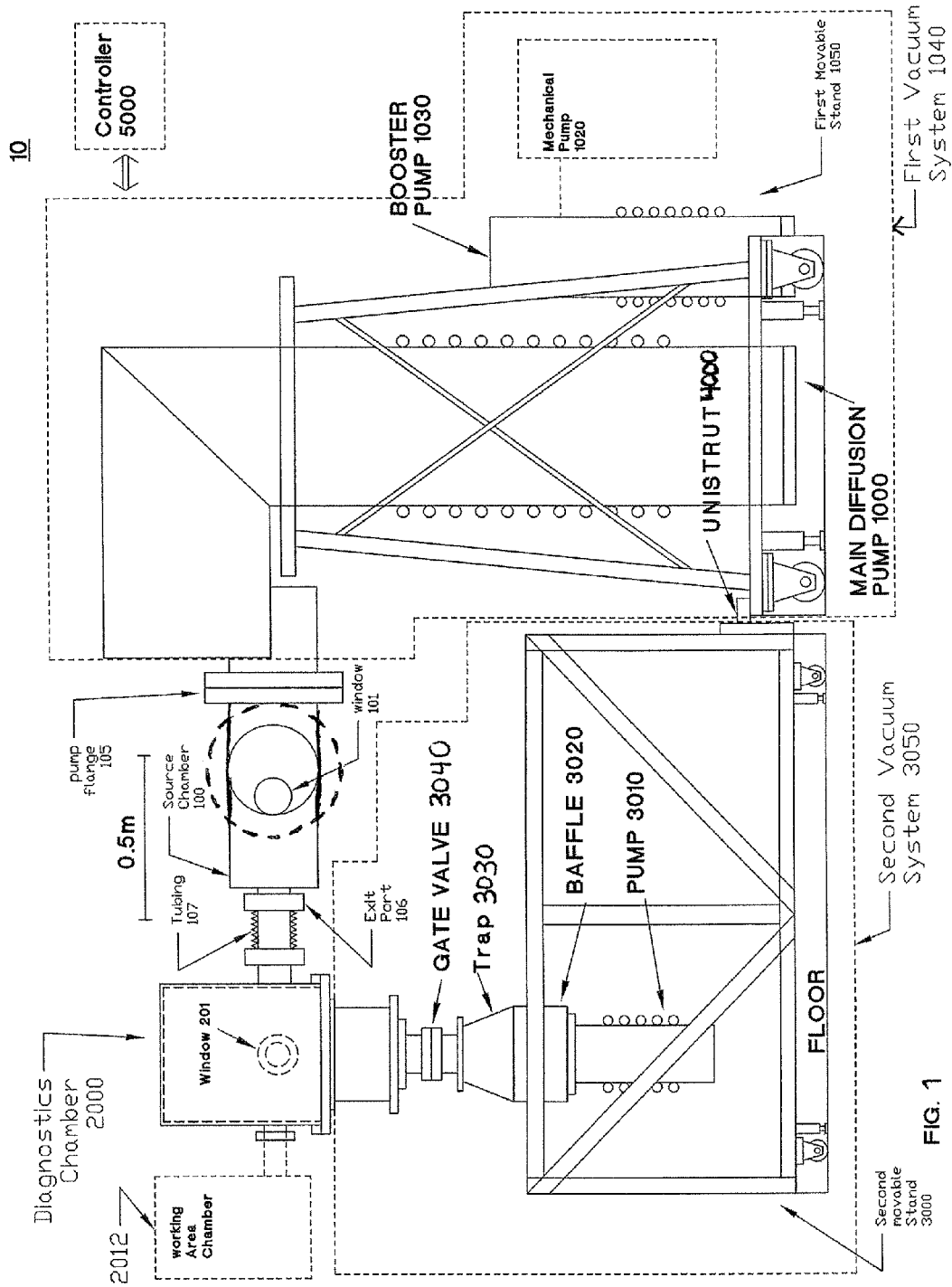
FIG. 1 illustrates an example of a hyperthermal beam system, in accordance with one aspect of the subject disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

According to one approach, hyperthermal beams may be produced using a seeded beam technique. A small concentration of heavy species (about 1% to 5%) may be mixed with a light, inert carrier gas. The heavy species may be aerodynamically accelerated by the bulk flow of the light gas. The energy available to the heavy molecule may be proportional to the ratio of the weights between the light and heavy molecules. Because some degree of slip may occur between the velocities of the light and heavy gas molecules, molecule intensities on the order of $10^{16}$ molecules $sr^{-1}$ $s^{-1}$ and energy of 1 electron volt (eV) are usually obtained. This technique, however, may not work for hydrogen atoms, since hydrogen is the lightest gas.

According to another approach, high-energy beams may be produced through a charge exchange process. A well-focused ion beam may be accelerated through a gas target of the neutral parent. Since the resonant charge transfer process cross section may be larger than momentum transfer, the neutral species generated may retain its original direction and energy distribution. However, space charge effects may limit the density of the ion beam and the amount of focusing that is possible. In the chemically desired regime of less than about 20 eV of translational energy (e.g., kinetic energy), weak intensities on the order of around $10^{16}$ molecules $sr^{-1}$ $s^{-1}$ may be obtained under this approach. As a result, because of the relatively weak intensities, charge exchange sources may be of little use for chemical reactions in this translational energy range.

According to another approach, a shock-tube method may achieve an intensity on the order of $10^{21}$ molecules $sr^{-1}$ $s^{-1}$ in the regime of about 0 eV to 20 eV of translational energy. The interested gas species may be heated upstream by means of a reflected shock wave such that the nozzle itself does not become too hot. This transient heating may create dissociation and electronic excitation in the gas. However, this type of beam source is not a continuous wave (CW) and may provide a beam pulse of a few milliseconds duration but with a poor duty factor. In addition, there may not be a simple way of creating alkali metal or hydrogen atoms with such a method.

In another approach, microwave or radio frequency discharge may be used to dissociate molecules to atoms. The source may be mounted inside a resonant cavity where the molecules dissociate due to electron bombardment. However, instabilities in the microwave generation as well as low translational energies of the generated atoms make it unattractive.

According to yet another approach, a hyperthermal beam of neutral atoms may be obtained using a plasma jet technique. A nozzle may be arranged so that an arc may be generated in the nozzle and the effective stagnation temperature may be raised to 10,000° Kelvin or higher. This source may be effective in the generation of argon atoms and beams with about 3 eV of translational energy and intensities of about $10^{19}$ atoms $sr^{-1}$ $s^{-1}$. Despite the advantages of this arc-discharge beam source, a difficulty with these sources is corrosion of the anode and cathode surfaces, creating dimensional instabilities, which may occur at these high operating temperatures.

Despite the existence of various approaches to generate hyperthermal beams, however, in one aspect of the subject disclosure, a method and apparatus is needed not only to accelerate selected neutral species to the desired translational energies but also to generate a collimated beam of these species over an area that could be used in chemical reactions for fabrication purposes. According to various aspects of the disclosure, the subject technology does not have the constraints imposed by the other approaches described above. According to various aspects of the subject disclosure, a source of intense monoenergetic atoms may be created, whose translational energy may be continuously tunable from about 0.5 to 20 eV. Such a beam source may enable the production of ultra high purity materials through chemical reduction of compounds.

According to various aspects of the subject disclosure, methods and apparatuses of producing an intense hyperthermal beam of neutral atoms are provided. Aspects of the subject technology involve using high power discharge sources to create a high temperature (e.g., around 10,000° K) plasma in which an elemental source (including one or more of an alkali metal, alkali earth group metal, or a hydrogen molecule) can be dissociated into atoms. Intense hyperthermal neutral atomic beams on the order of about $10^{22}$ atoms/sterad/sec and with translational energy (e.g., energy distribution) spanning a range of about 0.5 to 20 eV can be produced.

FIG. 1 illustrates an example of a hyperthermal beam system 10, in accordance with one aspect of the subject disclosure. Hyperthermal beam system 10 may comprise first vacuum system 1040, source chamber 100, tubing 107, diagnostics chamber 2000, second vacuum system 3050, controller 5000 and unistrut 4000. First vacuum system 1040 may comprise mechanical pump 1020, booster pump 1030, main diffusion pump 1000 and first movable stand 1050. Source chamber 100 may comprise window 101 and flange 105. Diagnostics chamber 2000 may comprise window 201. Second vacuum system 3050 may comprise second movable stand 3000, gate valve 3040, trap 3030, baffle 3020 and pump 3010. In some aspects, first vacuum system 1040 and second vacuum system 3050 comprise an overall vacuum system for hyperthermal beam system 10.

Main diffusion pump 1000 may be, for example, an oil diffusion pump, while booster pump 1030 may be an oil diffusion booster pump. In some aspects, main diffusion pump 1000, which can be about 12" to 20" in diameter, is used along with booster pump 1030, which can be about 6" to 10" in diameter. Both pumps may share a common oil reservoir to pump the source chamber 100. In some aspects, mechanical pump 1020 (e.g., mechanical roughing pump) may pump at a rated speed of about 30 ft$^3$/min to 40 ft$^3$/min and rough both main diffusion pump 1000 and booster pump 1030. In some aspects, main diffusion pump 1000 and booster pump 1030 may pump at a combined speed of about 4000 liter/sec at a pressure of about $10^{-4}$ torr. In some aspects, main diffusion pump 1000 and booster pump 1030 may pump at a combined speed of greater than 4000 liter/sec. In some aspects, the pressure generated by main diffusion pump 1000 and booster pump 1030 may be less than $10^{-4}$ torr.

According to various aspects of the subject disclosure, main diffusion pump 1000 and booster pump 1030 may be mounted onto first movable stand 1050. Mechanical pump 1020 may be connected to first movable stand 1050 via flexible tubing and may also be mounted on a movable base. In some aspects, source chamber 100 may be connected to main diffusion pump 1000 such that first vacuum system 1040 may provide a vacuum within source chamber 100. Source chamber 100 may also be connected to diagnostics chamber 2000 (e.g., small bell jar). Diagnostics chamber 2000 may be connected to second vacuum system 3050 such that second vacuum system 3050 may provide a vacuum within diagnostics chamber 2000. Diagnostics chamber 2000 may be mounted onto second movable stand 3000, which may be physically attached to first movable stand 1050 via unistrut 4000 to form one secure assembly.

In some aspects, diagnostics chamber 2000 may be mounted to the top of a pump 3010 (e.g., a mercury diffusion pump) and may be trapped by a baffle 3020 (e.g., Freon baffle) as well as a trap 3030 (e.g., liquid nitrogen trap or dewer). Pump 3010 may be isolated from diagnostics chamber 2000 via gate valve 3040. In some aspects, gate valve 3040 may be 6" in diameter. In some aspects, gate valve 3040 may be greater than about 6" or less than about 6" in diameter. In some aspects, the pump speed of second vacuum system 3050 may be about 100 liter/sec and may be capable of inducing a vacuum of about $10^{-6}$ torr. In some aspects, the pump speed of second vacuum system 3050 may be greater than about 100 liter/sec or may be less than about 100 liter/sec.

Figure 2A:
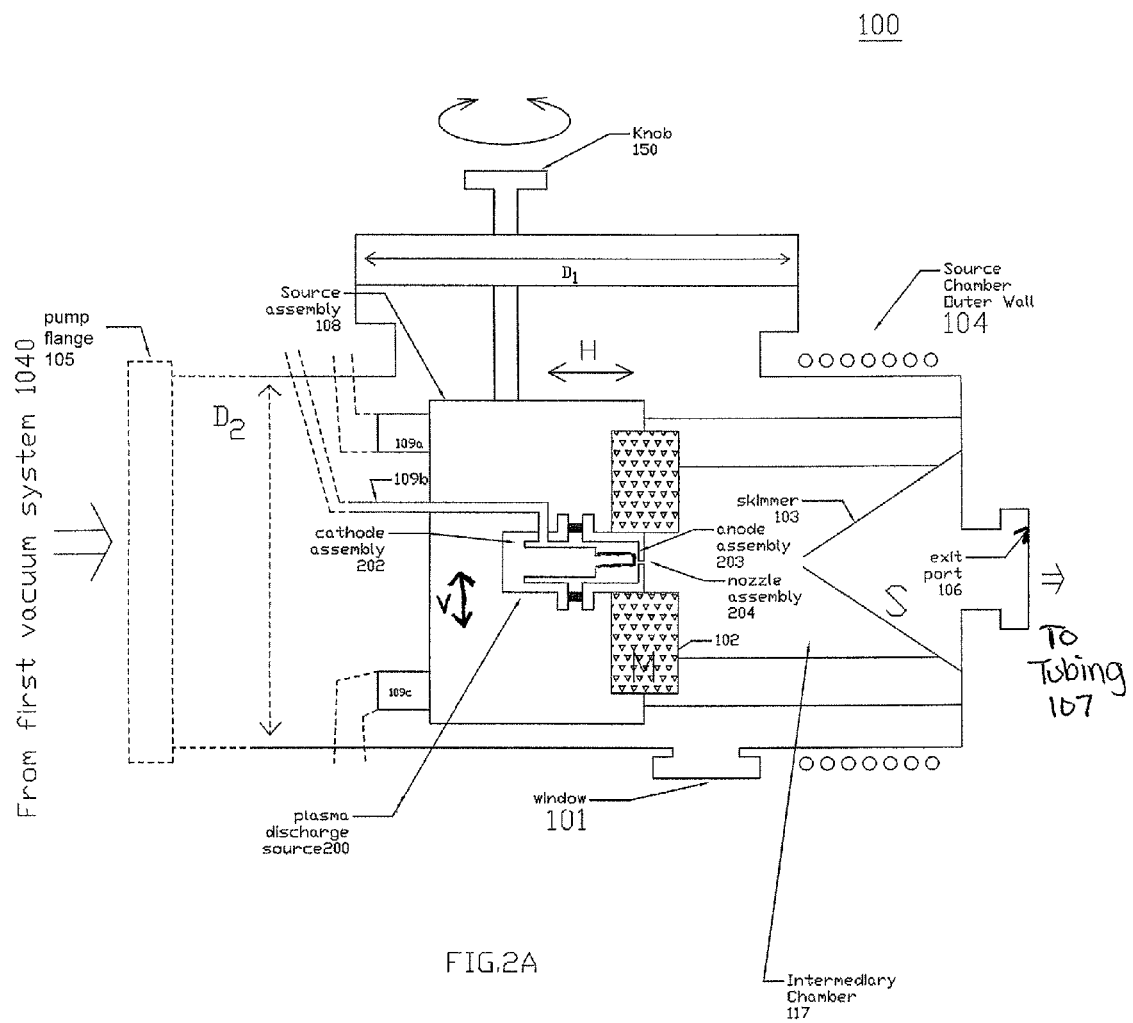
FIG. 2A illustrates an example of a source chamber, in accordance with one aspect of the subject disclosure.

FIG. 2A illustrates an example of a source chamber 100, in accordance with one aspect of the subject disclosure. Source chamber 100 may comprise pump flange 105, source assembly 108, knob 150, skimmer 103, source chamber outer wall 104 and exit port 106. Source assembly 108 may comprise plasma discharge source 200 (e.g., arc-source), magnetic source 102 and one or more conflate feed-throughs 109 (109a, 109b and 109c). Plasma discharge source 200 may comprise cathode assembly 202 and anode assembly 203. Anode assembly 203 may comprise nozzle assembly 204. Plasma discharge source 200 and its components are also described in more detail later, for example, with reference to FIGS. 4, 5, 6, 7A and 7B.

In some aspects, source chamber 100 may have the shape of an "L" as viewed from FIG. 2A. Source chamber 100 may include diameters $D_1$ and $D_2$. For example, $D_2$ may be 24" while $D_1$ may be 12". In some aspects, source chamber 100 may be built from stainless steel tubes or other suitable metals. Pump flange 105 connects source chamber 100 to first vacuum system 1040. Pump flange 105, for example, may be 12" in diameter and comprise a Teflon O-ring seal. Knob 150 may be used to move source assembly 108 within source chamber 100. In one example, source assembly 108 may move along a direction parallel to a horizontal axis H to adjust the horizontal distance between source assembly 108 and skimmer 103. Conflate feed-throughs 109 may be used to pass electrical power (e.g., current and/or voltage), cooling water, and one or more elemental sources to plasma discharge source 200 and magnetic source 102.

An elemental source may comprise one or more of an alkali metal, an alkali earth group metal, hydrogen, or noble gases. By way of illustration and not limitation, an elemental source may be one of the following: (i) one or more alkali metals; (ii) one or more alkali earth group metals; (iii) hydrogen gas; (iv) one or more noble gases; or (v) any combination of (i), (ii), (iii) and/or (iv). For example, an elemental source may comprise one or more alkali metals and one or more noble gases. In one example, an elemental source may comprise hydrogen molecules and/or argon molecules. In another example, an elemental source may comprise sodium molecules and argon molecules. In some aspects, alkali metals may comprise, for example, Group I of the periodic table (e.g., the Table of Periodic Properties of the Elements (Catalog Number WLS-18806-10) published by Sargent-Welch VWR International), which may include lithium, sodium, potassium, rubidium, cesium and francium. The alkali earth group metals may comprise, for example, Group II of the periodic table, which may include beryllium, magnesium, calcium, strontium, barium and radium. The noble gases may comprise, for example, Group 18 of the periodic table, which may include helium, neon, argon, krypton, xenon and radon.

According to various aspects of the disclosure, the beam source may be based on neutralization and reflection of ions at surfaces. In one aspect of the disclosure, plasma discharge source 200 may receive one or more elemental sources from feed-through 109b and generate plasma based on the one or more elemental sources. In some aspects, the plasma may comprise one or more ions of the elemental source. Plasma discharge source 200 may create an arc between anode assembly 203 and cathode assembly 202 and cause the one or more elemental sources (e.g., molecules) to dissociate into one or more ions to form the plasma. Electrons emitted from the negative electrode (e.g., cathode assembly 202) may be directed to the positive electrode (e.g., anode assembly 203) and accelerated by positive potential, and the electrons may collide with the elemental sources and generate many more ions that are confined into a beam with magnetic characteristics. An intense atomic beam (e.g., a hyperthermal beam) may be produced by neutralization and reflection of impinging ions at the dissociation chamber surface.

According to various aspects of the subject disclosure, beam generating components (e.g., source assembly 108, plasma discharge source 200, magnetic source 102, skimmer 103, intermediary chamber 117) besides an electrical power source for the beam source and a discharge stabilizing resistor (not shown) may be housed in a vacuum container (e.g., source chamber 100). After this container has been sufficiently evacuated, a noble gas, such as argon gas in this example, may be introduced into a cylindrical negative electrode (e.g., cathode assembly 202) through a gas inlet tube (e.g., feed-through 109b). A direct current (dc) voltage may be applied from a high voltage dc source (e.g., via feed-throughs 109a and 109c) so that a positive electrode (e.g., anode assembly 203) may be at a positive potential and a negative electrode (e.g., cathode assembly 202) may be at a negative potential. As a result, an electrical discharge occurring between the positive and negative electrodes may generate a plasma, thereby providing argon ions and electrons. The argon ions, which may be injected into this space between the electrodes, may return to argon atoms by colliding/recombining with the electrons. Because the mass of electrons may be negligibly small in comparison to argon ions, the kinetic energy of argon ions may almost not be affected by the collision process with the electrons, and the kinetic energy of argon ions may be transferred substantially to the argon atoms to produce a fast atomic beam (e.g., a hyperthermal beam).

In one aspect, one or more ions may comprise one or more types of ions. In another aspect, one or more ions may comprise multiple ions. Similarly, in one aspect, one or more neutral atoms may comprise one or more types of neutral atoms. In another aspect, one or more neutral atoms may comprise multiple neutral atoms. In one example, if an elemental source is introduced in the following manner-argon molecules first, hydrogen molecules next, followed by stopping the intake of argon molecules-then the plasma (e.g., the one or more ions) may include initially one type of ions (e.g., argon), then two types of ions (e.g., argon and hydrogen), and then finally one type of ions (e.g., hydrogen). The one or more neutral atoms produced can be initially one type of neutral atoms (e.g., argon), then two types of neutral atoms (e.g., argon and hydrogen), and then finally one type of neutral atoms (e.g., hydrogen).

According to various aspects of the subject disclosure, an emission system may be configured to emit a hyperthermal beam, including one or more neutral atoms, from plasma discharge source 200 through nozzle assembly 204. In one aspect, an emission system may be configured to emit a hyperthermal beam from plasma discharge source 200, through an aperture in nozzle assembly 204, to intermediary chamber 117 towards skimmer 103. For instance, a pressure differential may be created between an interior of plasma discharge source 200 and an exterior of the plasma discharge source 200 (intermediary chamber 117 in this example) by pumping down the pressure in source chamber 100 by first vacuum system 1040 and injecting the elemental source into the interior of plasma discharge source 200. In this example, the pressure level in the interior of plasma discharge source 200 is higher than the pressure level in the exterior of the plasma discharge source 200. This pressure differential can allow the one or more neutral atoms to be drawn out as a hyperthermal beam from plasma discharge source 200 into intermediary chamber 117.

In one example, an emission system may comprise first vacuum system 1040 (or a portion thereof), an interior of plasma discharge source 200, an exterior of the plasma discharge source 200, an aperture of nozzle assembly 204, and feed-through 109b. In another example, an emission system may comprise only a subset of the foregoing components. In yet another example, an emission system may include other additional components. In yet another example, an emission system may comprise a different structure (e.g., different component(s) or configuration(s)) that can emit a hyperthermal beam from plasma discharge source 200. These are illustrative examples, and the subject technology is not limited to these examples. In some aspects, the pressure differential may be, for example, between about 300 to $10^{-1}$ torr.

In some aspects, by generating an arc between anode assembly 203 and cathode assembly 202 near an aperture in nozzle assembly 204, one or more elemental sources may pass through the arc as they are drawn towards the aperture in nozzle assembly 204 as a result of the pressure differential.

Figure 2B:
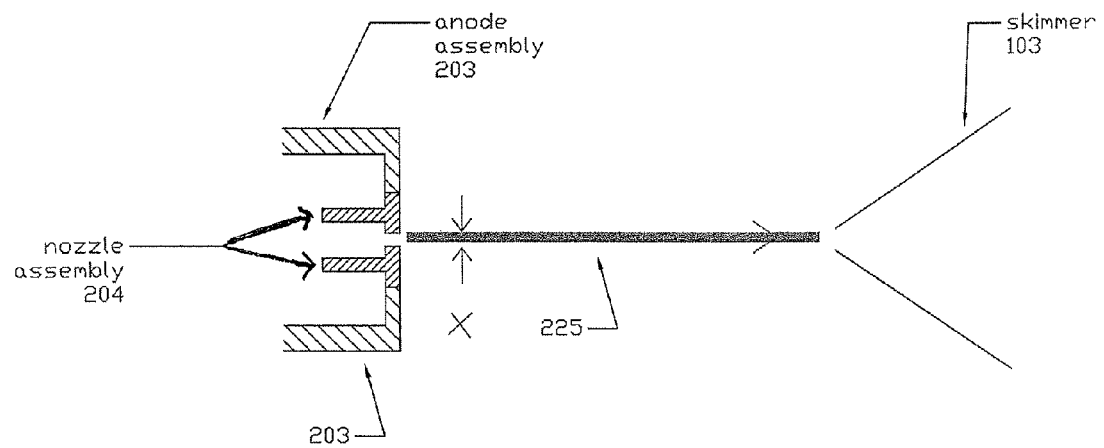
FIG. 2B illustrates an example of a collimated hyperthermal beam.

In one aspect, magnetic source 102 may provide a magnetic field, and this magnetic field can facilitate collimating a hyperthermal beam in a first direction (e.g., parallel to horizontal direction H or perpendicular to vertical direction V) and focusing the hyperthermal beam to control the size (e.g., diameter) of the hyperthermal beam exiting the aperture of nozzle assembly 204. This magnetic field can allow the hyperthermal beam to travel generally along a horizontal direction parallel to the horizontal axis H and vertically at the level of the aperture of nozzle assembly 204 towards skimmer 103. In some aspects, by controlling the current and/or voltage applied to magnetic source 102 (e.g., via controller 5000), the magnetic field may be tunable or adjustable. FIG. 2B illustrates an example of a hyperthermal beam 225 that is collimated and has a controlled size X and that travels from an aperture of nozzle assembly 204 to skimmer 103.

The magnetic field provided by magnetic source 102 may generate a radially compressive force acting on the ions of the plasma located at or near the aperture of nozzle assembly 204. This, for example, may force the plasma ions to remain at or near the aperture of nozzle assembly 204, and allow neutral atoms to be formed from the plasma ions at this location and be emitted as a hyperthermal beam having a controlled size and in one direction. Radially compressing the plasma at or near the aperture of nozzle assembly 204 may minimize or prevent contact between the plasma flame and the surrounding walls of anode assembly 203 and/or nozzle assembly 204. Such contact may cause damage to the surrounding walls because of the high temperature of the plasma flame. In some aspects, the magnetic field provided by magnetic source 102 may generate a radially compressive force acting on the hyperthermal beam to control the size of the hyperthermal beam.

The radially compressive force generated by magnetic source 102 utilizing the magnetic field may vary depending on the amount of voltage and/or current applied to magnetic source 102. For example, magnetic source 102 may generate a magnetic field such that the plasma flame may have an adjustable diameter, for example, between about 0.5 to 4 mm. Without magnetic source 102, the plasma flame may have a diameter greater than, for example, about 30 mm. In another example, magnetic source 102 may generate a magnetic field such that the hyperthermal beam, as it exits the aperture of nozzle assembly 204, may have an adjustable diameter, for example, between about 0.5 to 2 mm. Without magnetic source 102, the hyperthermal beam may have a diameter greater than, for example, about 15 mm.

Figure 2C:
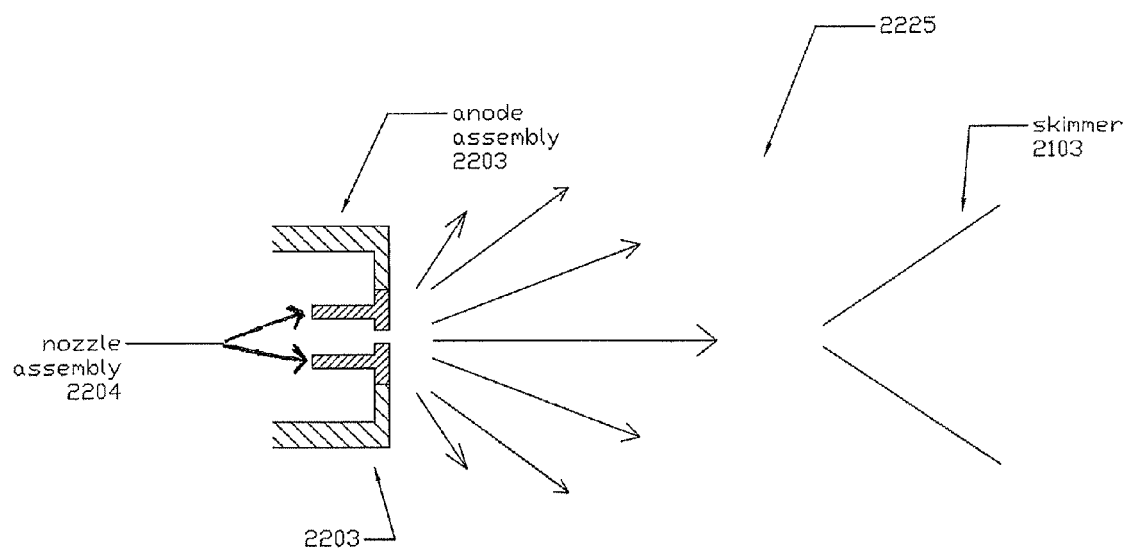
FIG. 2C illustrates an example of neutral atoms being emitted from a nozzle assembly.

Plasma discharge source 200 may be mounted into the center of magnetic source 102. For example, magnetic source 102 may be a 6" diameter electromagnet. In another aspect, magnetic source 102 may comprise one or more magnets. In yet another aspect, magnetic source 102 may be another type of source that can generate a magnetic field. Because magnetic source 102 generates heat, magnetic source 102 may be water-cooled. In some aspects, the magnetic source 102 may operate, for example, at 20 volts and 20 amperes. In some aspects, operating magnetic source 102 at this level may result in, for example, a tunable magnetic field between about 3-kilogauss to 0.5-kilogauss field strength in the center of magnetic source 102 as measured with a Gauss meter. In accordance with various aspects of the subject disclosure, this field may stabilize the plasma by providing a radially compressive force (e.g., a perpendicular force) on any ions which may attempt to leave the beam, directing them instead to remain in the center of the free jet expansion (which is located at or near the aperture of nozzle assembly 204 in this example). As illustrated in FIG. 2C, without magnetic source 102, neutral atoms 2225 may spread freely in all directions (e.g., without forming a collimated beam with a controlled size), except not into anode assembly 2203, as they are emitted from nozzle assembly 2204 towards skimmer 2103.

In some aspects, exit port 106 may be 6" in diameter, for example. Skimmer 103 may include a water-cooled base and may be mounted at the end of source chamber 100 via an O-ring seal, so that an aperture of nozzle assembly 204 and skimmer 103 are in alignment with the center of exit port 106. In some aspects, skimmer 103 may further focus a hyperthermal beam. The size of the hyperthermal beam arriving at skimmer 103 may be potentially larger than that of the hyperthermal beam at the aperture of nozzle assembly 204 due to the travel distance between nozzle assembly 204 and skimmer 103. In some aspects, skimmer 103 may further focus a hyperthermal beam such that the diameter of the hyperthermal beam at the inlet of skimmer 103 may be, for example, between about 0.5 to 2 mm It is through exit port 106 that source chamber 100 is mated with diagnostics chamber 2000 via tubing 107. Tubing 107 may be flexible tubing. Source chamber outer wall 104 may be a quarter-inch copper tubing that is welded around the outside of source chamber 100 to ensure efficient cooling. Window 101 may be a quartz window to permit viewing of the operation of source chamber 100. In some aspects, window 101 may be fitted on a 6" flange.

According to various aspects of the subject disclosure, by controlling the voltage and current input into plasma discharge source 200, the translational energy and intensity of the hyperthermal beam may be selected. For example, controller 5000 in FIG. 1 may control a current and a voltage applied to plasma discharge source 200. The translational energy of the hyperthermal beam is tunable based on the current and/or the voltage applied to plasma discharge source 200. The intensity of the hyperthermal beam is tunable based on the current and/or the voltage applied to plasma discharge source 200. In some aspects, the translation energy may be tunable from about 0.5 to 20 eV with operating voltages between about 50-400 volts. In some aspects, the intensity may be tunable up to an order of about $10^{22}$ atoms/sterad/sec. In some aspects, the hyperthermal beam is a continuous wave or a continuous beam (e.g., a hyperthermal beam is not a beam pulse).

Many chemical reactions can be promoted by a hyperthermal beam of neutral atoms in the chemically desired regime of less than about 20 eV of translational energy (e.g., kinetic energy). In some aspects, a hyperthermal beam may comprise a beam having a translational energy between about 0.5 eV to 20 eV. In another aspect, a hyperthermal beam may comprise a beam having a translational energy less than about 0.5 eV and greater than about 0 eV. In yet another aspect, a hyperthermal beam may comprise a beam having a translational energy greater than about 20 eV.

Referring back to FIG. 1, diagnostics chamber 2000 may contain one or more diagnostic devices (e.g., diagnostic equipment) to analyze the hyperthermal beam generated at source chamber 100. In some aspects, diagnostics chamber 2000 may for example be 24" in diameter. Diagnostics chamber 2000 may have one or more conflate flanges. For example, one conflate flange may be used to mate the diagnostics chamber 2000 to tubing 107 to connect to source chamber 100. Another conflate flange may include window 201 to provide a view of inside diagnostics chamber 2000. In some aspects, window 201 may be a quartz window. Another conflate flange may be directly in front of the entering hyperthermal beam and may have, for example, an EAI Quad 300 mass spectrometer mounted to allow analysis of the entering hyperthermal beam. Diagnostics chamber 2000 can be moved independently of its base via perpendicular push-pull screws mounted to the base (e.g., second movable stand 3000). This may permit movement of the mass spectrometer relative to the incoming hyperthermal beam to provide alignment between nozzle assembly 204 and skimmer 103 in source chamber 100 and the mass spectrometer itself. The floor of diagnostics chamber 2000 may have a circle of tapped holes on the floor of the pump chamber surrounding the pump pole.

Figure 3A:
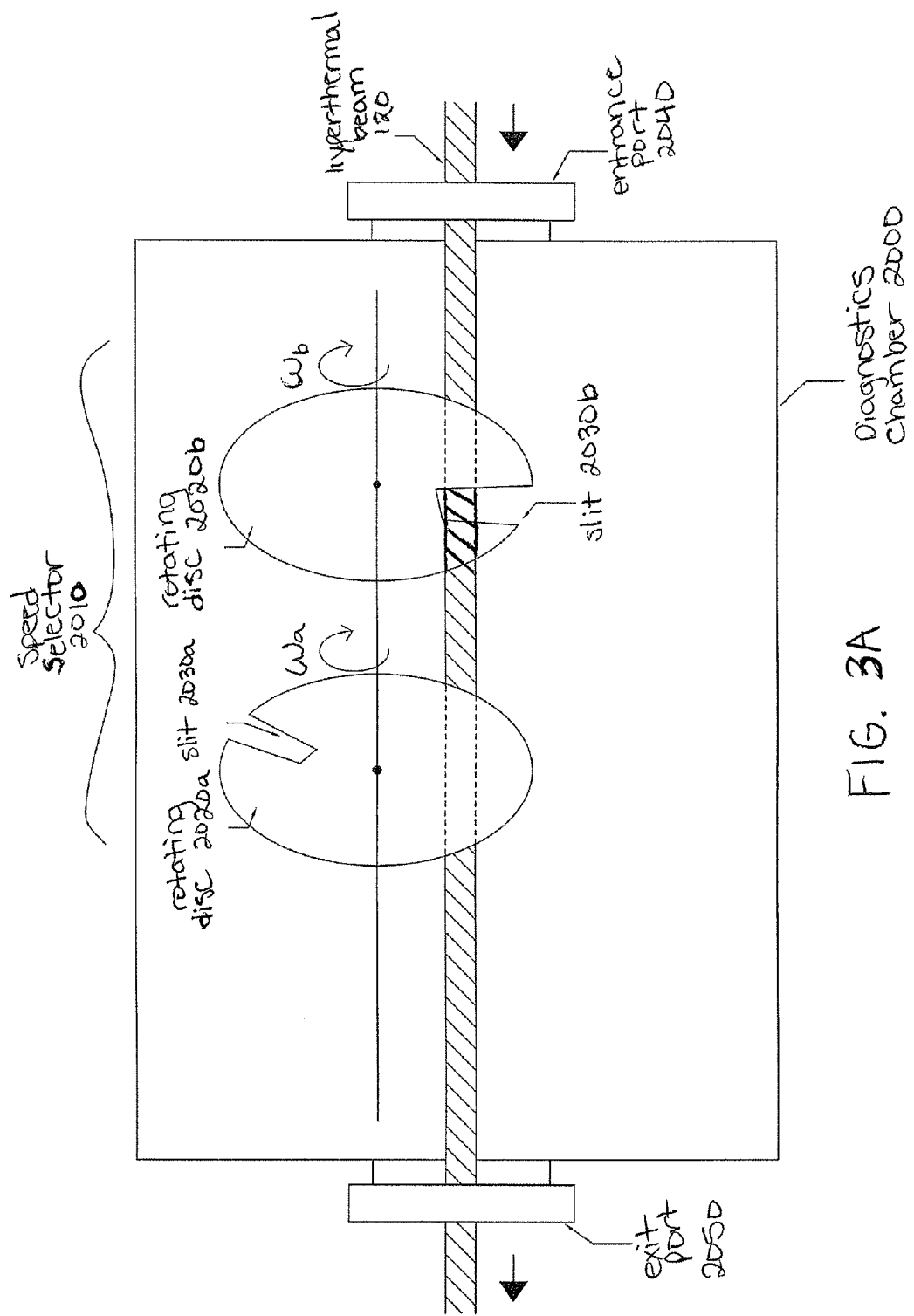
FIG. 3A illustrates an example of a diagnostic device that may be utilized in diagnostics chamber, in accordance with one aspect of the subject disclosure.

FIG. 3A illustrates an example of a diagnostic device that may be utilized in diagnostics chamber 2000, according to one aspect of the subject disclosure. Diagnostics chamber 2000 may comprise a speed selector 2010 configured to select a translational energy of the hyperthermal beam 120 (e.g., select atoms having only a certain translation energy). In one aspect, speed selector 2010 may accomplish this by only allowing certain portions (e.g., certain atoms) of the hyperthermal beam 120 to be transmitted from entrance port 2040 to exit port 2050. Speed selector 2010 may comprise one or more rotatable discs 2020 (e.g., 2020a and 2020b) configured to allow a portion of the hyperthermal beam 120 to pass through the rotatable discs 2020 based on a rotational speed ω (e.g., $\omega_a$ and $\omega_b$) of the rotatable discs 2020 and a size of a slit 2030 (e.g., 2030a and 2030b) on the rotatable discs 2020.

Figure 3B:
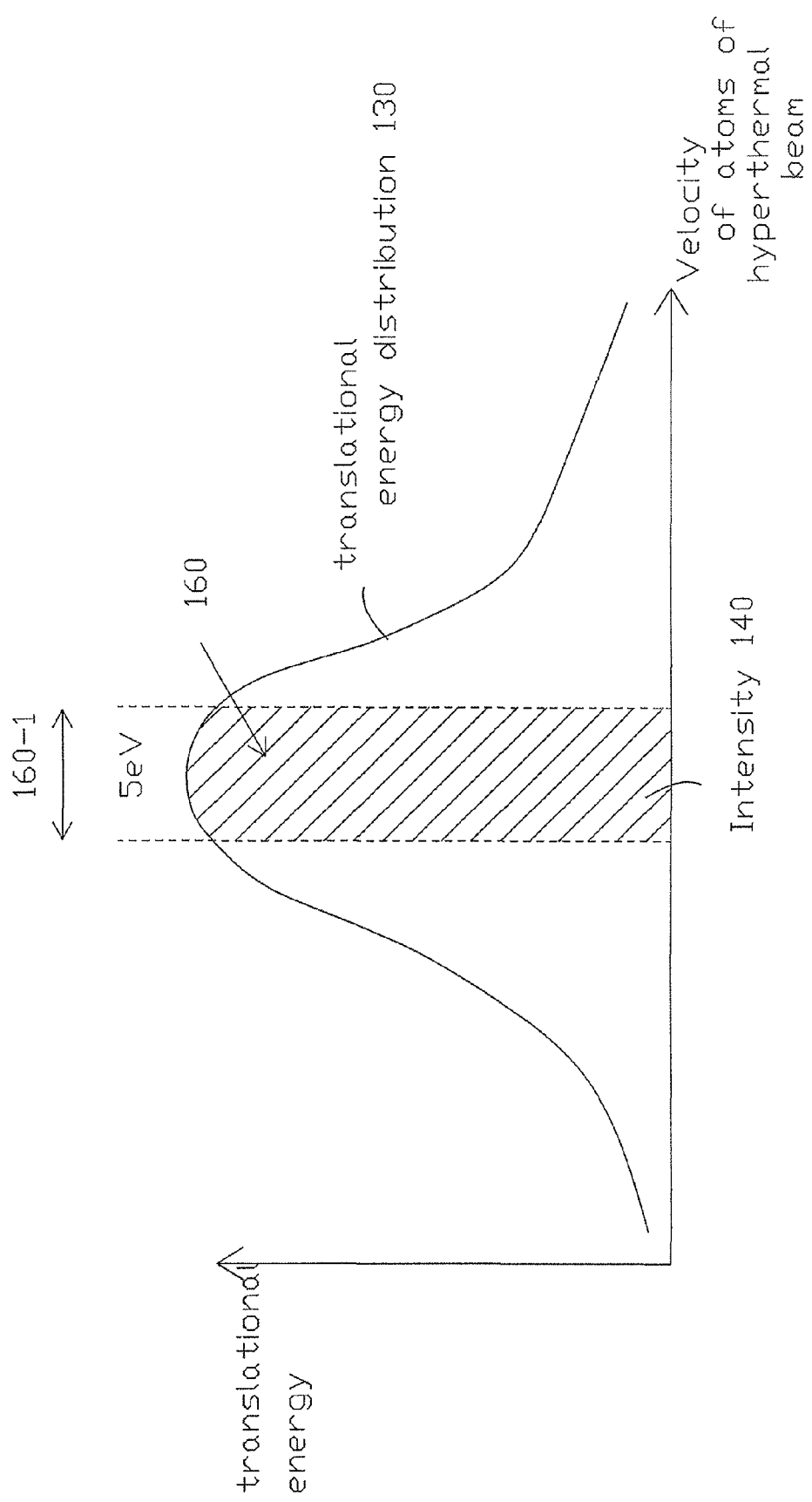
FIG. 3B illustrates an example of a translational energy distribution for a hyperthermal beam, in accordance with one aspect of the subject disclosure.

For example, referring to FIG. 3B, the atoms of hyperthermal beam 120 may be traveling at different velocities, thus having different translational energies depending on the velocity of the atoms. As a result, hyperthermal beam 120 may have a translational energy distribution 130 as shown in FIG. 3B. Speed selector 2010, by adjusting the rotational speed ω and the size of slits 2030, may act as a filter to allow only desired portions 160 (e.g., velocities) of hyperthermal beam 120 to pass through to exit port 2050. The portion of hyperthermal beam 120 that passes through to exit port 2050 may be considered to have a specific translational energy. Accordingly, the portion of hyperthermal beam 120 that exits diagnostics chamber 2000 may have, for example, a translational energy with an energy spread (e.g., 160-1) that is narrower than that of hyperthermal beam 120 that enters diagnostics chamber 2000.

In one example, the rotational speed ω and the size of slits 2030 may be adjusted such that only the portion of hyperthermal beam 120 that passes through to exit port 2050 has a translational energy of roughly 5 eV as its average value, and its energy spread can be, for example, about ±0.5 eV. In one aspect, an average value of a translational energy may be based on, for example, the rotational speed, and the energy spread may be based on, for example, the size of slits. Thus, according to certain aspects of the subject disclosure, the translational energy of hyperthermal beam 120 may be selected or adjusted by utilizing speed selector 2010. In some aspects, the translational energy of hyperthermal beam 120 can be similarly selected or adjusted by varying how much voltage or current is applied to magnetic source 102 and/or plasma discharge source 200 to change the velocity of hyperthermal beam 120. In some aspects, the translational energy or intensity of hyperthermal beam 120 may be continuously adjustable, tunable, or selectable.

As shown in FIG. 3B, the intensity 140 of hyperthermal beam 120 may be given by the area under the translational energy distribution. Thus, there may be a tradeoff between precisely selecting a translational energy and maintaining a high intensity 140. The more precise and narrow range of translational energy selected may result in a lower intensity 140. Conversely, the less precise and wider range of translational energy selected may result in a higher intensity 140. According to certain aspects of the subject disclosure, a translational energy between about 0.5 and 20 eV and an intensity on the order of about $10^{22}$ atoms/sterad/sec may be achieved utilizing the subject technology. In one aspect, the other portions of hyperthermal beam 120 that do not pass through the slits 2030, are stopped by the rotatable discs 2020. In some aspects, the one or more rotatable discs comprise tungsten or other suitable metals that can endure the heat and energy generated by hyperthermal beam 120.

Figure 4:
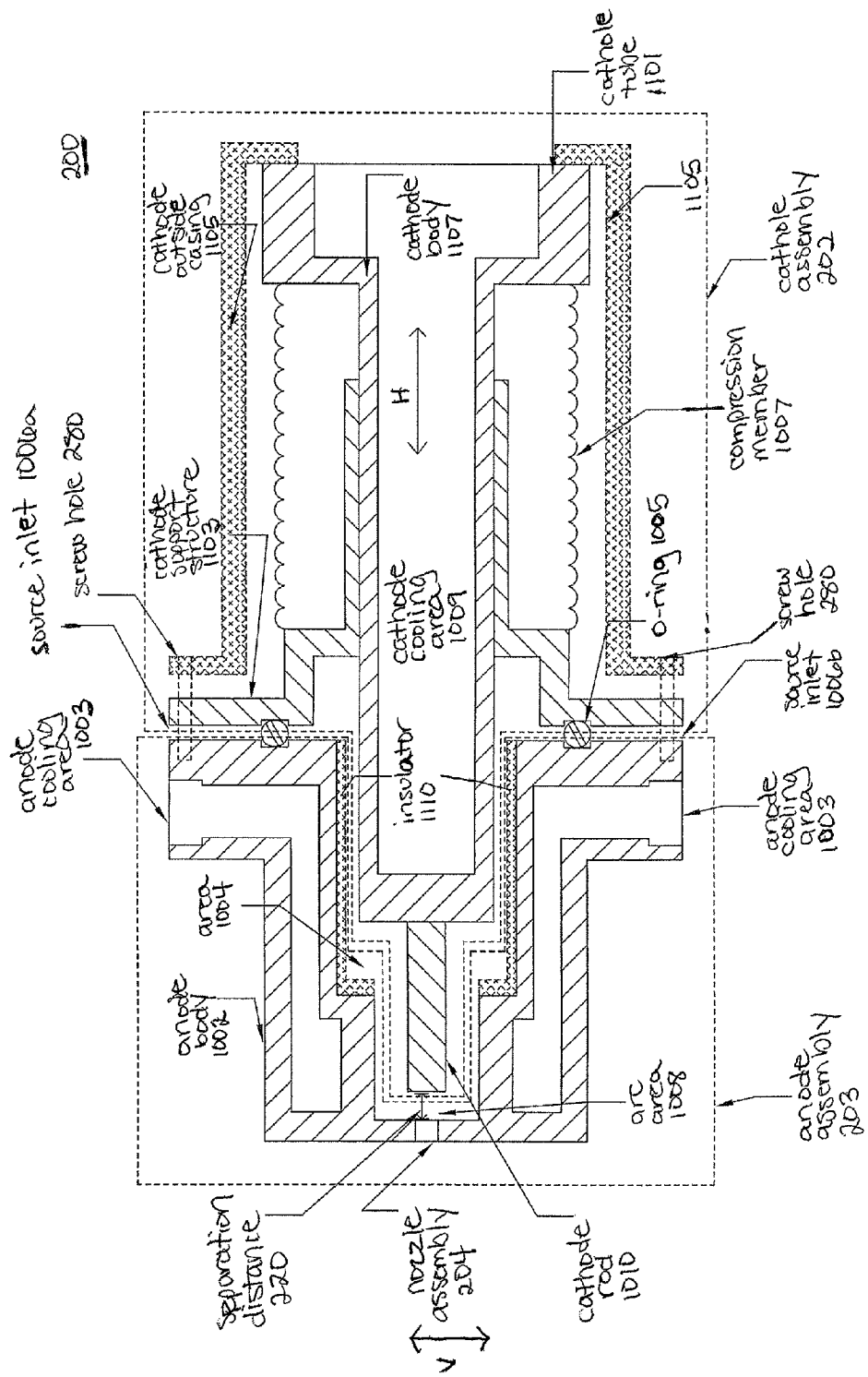
FIG. 4 shows a cutaway schematic view of a plasma discharge source, in accordance with one aspect of the subject disclosure.

FIG. 4 shows a cutaway schematic view of plasma discharge source 200, in accordance with one aspect of the subject disclosure. Plasma discharge source 200 may comprise anode assembly 203 and cathode assembly 202. Anode assembly 203 may comprise nozzle assembly 204, anode cooling area 1003, anode body 1002 and insulator 1110. Cathode assembly 202 may comprise cathode rod 1010, cathode cooling area 1009, cathode body 1107 and one or more compression members 1007 coupled to cathode rod 1010. Cathode body may comprise cathode support structure 1103, cathode tube 1101, and cathode outside casing 1105.

Anode assembly 203 and nozzle assembly 204 are also described in more detail later, for example, with reference to FIGS. 7A and 7B. Cathode assembly 202 is also described in more detail later, for example, with reference to FIGS. 5 and 6.

In some aspects, one or more compression members 1007 may compress or expand such that cathode rod 1010 is configured to move relative to anode assembly 203 parallel to the horizontal axis H and perpendicular to a vertical axis V. A separation distance 220 between nozzle assembly 204 and a cathode tip of cathode rod 1010 is adjustable based on movement of the cathode rod 1010. Plasma discharge source 200 may generate an arc (e.g., a voltage pulse) between nozzle assembly 204 and the cathode tip based on the separation distance 220.

In one aspect, insulator 1110 may be adjacent to at least a portion of cathode rod 1010 and/or at least a portion of cathode body 1107, and is configured to electrically insulate anode assembly 203 from at least a portion of cathode rod 1010 and/or at least a portion of cathode body 1107 adjacent to insulator 1110. In another aspect, insulator 1110 may surround at least a portion of cathode rod 1010 and/or at least a portion of cathode body 1107. In another aspect, insulator 1110 may be directly attached to a surface of anode body 1002 facing the at least a portion of cathode rod 1010 and/or the at least a portion of cathode body 1107. In another aspect, insulator 1110 may be separated from the at least a portion of cathode rod 1010 and/or the at least a portion of cathode body 1107 by a hollow space (e.g., 1004). In yet another aspect, insulator 1110 may face an outer surface of the at least a portion of cathode rod 1010 and/or an outer surface of the at least a portion of cathode body 1107. In yet another aspect, insulator 1110 is not in direct contact with the at least a portion of cathode rod 1010 and/or the at least a portion of cathode body 1107. In yet another aspect, insulator 1110 does not cover the surface of nozzle assembly 204 that faces cathode rod 1010. In some aspects, the cathode tip of cathode rod 1010 is not adjacent to insulator 1110. In yet another aspect, the cathode tip is not insulated from nozzle assembly 204 by insulator 1110. In another configuration, insulator 1110 may extend into nozzle assembly 204, except for the exit point of nozzle assembly 204 (e.g., nozzle disc 1130 of FIGS. 7A and 7B). The descriptions provided above are examples, and the subject technology is not limited to these examples.

According to certain aspects of the subject disclosure, plasma discharge source 200 may allow one or more elemental sources (e.g., in a form of gas) to be introduced into area 1004 between a fixed anode body 1002 and a movable cathode rod 1010 through source inlets 1006 (e.g., 1006a and 1006b). Placing plasma discharge source 200 and intermediary chamber 117 (FIG. 2A) within source chamber 100 (e.g., a vacuum chamber) and injecting gas into area 1004 may create a pressure differential between area 1004 and intermediary chamber 117, and allow the one or neutral atoms generated to be drawn out, as a hyperthermal beam, into intermediary chamber 117. An arc (e.g., a high voltage pulse), between nozzle assembly 204 and a cathode tip of cathode rod 1010, combined with one or more elemental sources may create a plasma flame between nozzle assembly 204 and the cathode tip. Due to the expansion of gas through nozzle assembly 204, the plasma flame may extend beyond nozzle assembly 203 itself to intermediary chamber 117, thus carrying away some of the heat generated. This arc may produce very high temperatures (e.g., greater than about 10000° K) which may require efficient cooling of metal surfaces of plasma discharge source 200 to avoid its deterioration.

According to some aspects, anode body 1002 is hollow to provide anode cooling area 1003, and cathode body 1107 is hollow to provide cathode cooling area 1009. Water lines may be used to insert water into anode cooling area 1003 and cathode cooling area 1009 to provide cooling for plasma discharge source 200. In some aspects, a hose that is electrically non-conducting (e.g., plastic) may provide cooling water for these water lines in order to cool anode assembly 203 and cathode assembly 202.

Figure 5:
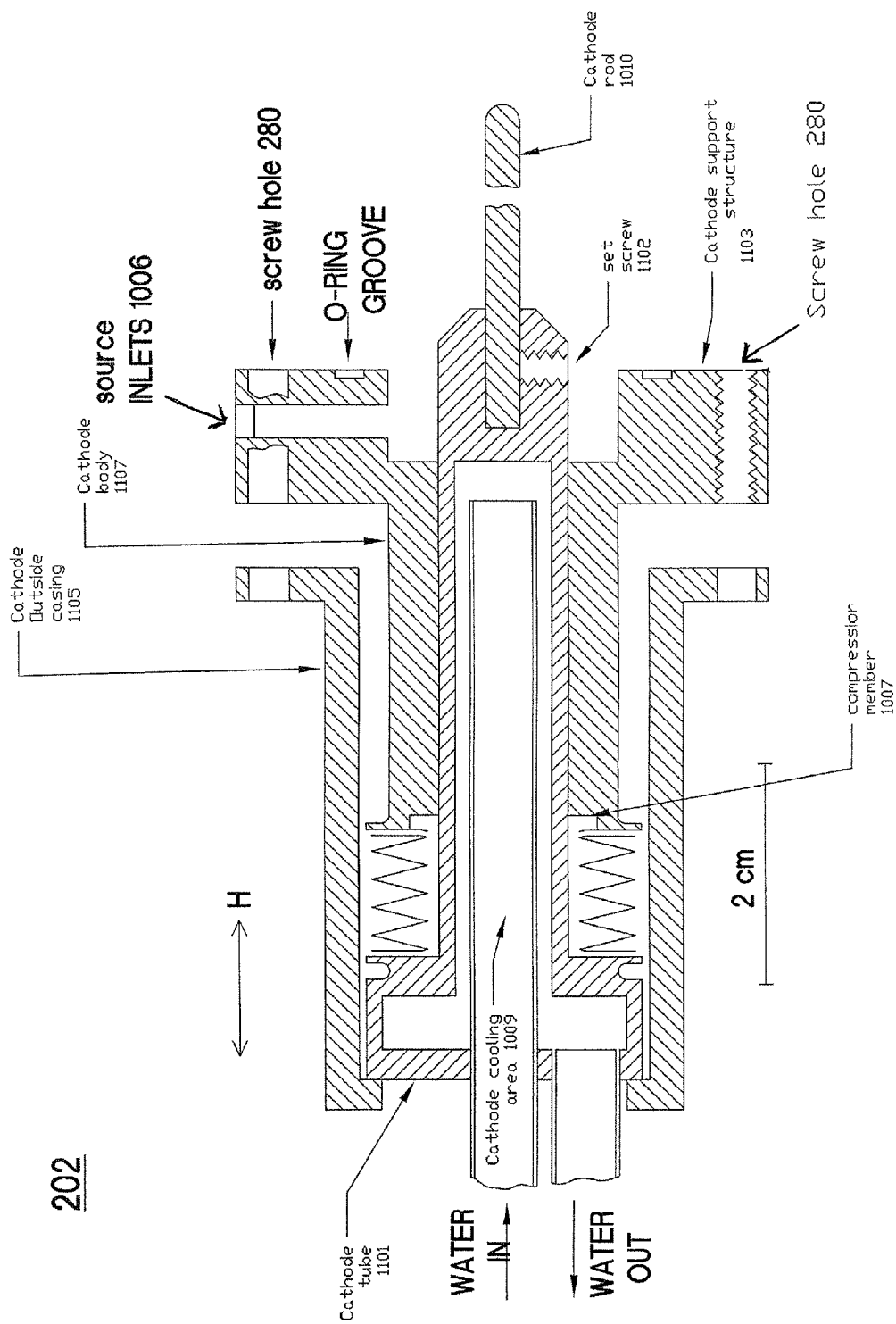
FIG. 5 illustrates a cathode assembly, in accordance with one aspect of the subject disclosure.

Cathode assembly 202 is illustrated in FIG. 5, in accordance with one aspect of the subject disclosure. Cathode body 1107, which may include cathode support structure 1103, cathode tube 1101 (e.g., a hollow tube), and cathode outside casing 1105, may be made of various materials, including for example and without limitation, copper, brass, stainless steel, or other suitable materials. The cathode rod 1010 may be made of various materials, including for example and without limitation, tungsten or other suitable materials capable of withstanding high temperatures. For example, cathode rod 1010 may be made of 2% thoriated tungsten and is capable of withstanding temperatures in excess of 3000 K. Compression member 1007 may comprise one or more bellows, springs, or other apparatuses capable of moving cathode rod 1010 towards or away from nozzle assembly 204. In an alternate configuration, other types of mechanism can be employed to move cathode rod 1010.

In some aspects, the diameter of the tip of cathode rod 1010 may be about 1.125". In another configuration, the diameter of the tip of cathode rod 1010 may be greater than about 1.125" or less than about 1.125". In some aspects, the shapes for the tip of cathode rod 1010 may vary. For example, the tip of cathode rod 1010 may have a rounded end or a sharp end. Cathode rod 1010 may be attached by a set screw 1102 to the base of cathode tube 1101 in a way which allows for water cooling of cathode tube 1101, as well as cathode rod 1010. Cathode tube 1101 may be fitted inside of cathode support structure 1103 such that cathode tube 1101 can move with respect to the latter. For example, in some aspects, cathode tube 1101 may move 0.75" with respect to cathode support structure 1103. Compression member 1007 (e.g., a brass bellow) may be silver soldered between cathode tube 1101 and cathode support structure 1103 to maintain a vacuum tight assembly. Once set, the position of cathode tube 1101 may be held in place via cathode outside casing 1105.

Figure 6:
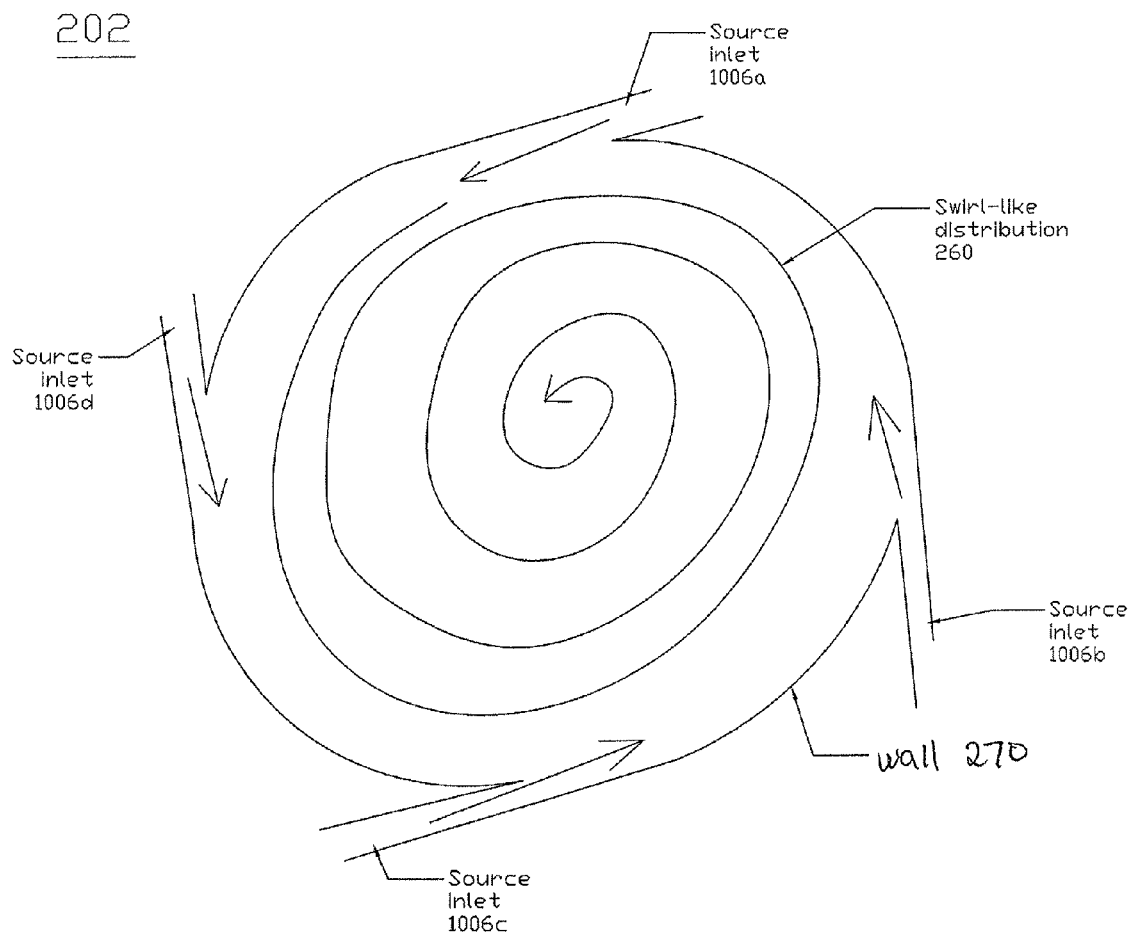
FIG. 6 illustrates an example of source inlets of a cathode assembly, in accordance with one aspect of the subject disclosure.

FIG. 6 illustrates an example of source inlets 1006 (e.g., 1006a, 1006b, 1006c, 1006d) of cathode assembly 202, in accordance with one aspect of the subject disclosure. Cathode assembly 202 is shown in a cross-sectional view. Plasma discharge source 200 may receive multiple elemental sources. For example, cathode assembly 202 of plasma discharge source 200 may comprise one or more source inlets 1006 configured to receive one or more elemental sources. In some aspects, source inlets 1006 may be gas inlets. In some aspects, source inlets 1006 may be angled substantially tangential to a wall 270 (e.g., cathode support structure 1103) of cathode assembly 202 such that cathode assembly 202 is configured to receive the one or more elemental sources in a swirl-like distribution 260. For example, two source inlets 1006 (e.g., 1006a and 1006c) may be drilled at sharp angles through the wall 270 on opposite sides of source chamber 100 located between cathode assembly 202 and anode assembly 203. This may have the effect of causing the elemental source (e.g., gas) to swirl around inside plasma discharge source 200, creating a more stable flow through nozzle assembly 204, thereby stabilizing the arc. In some aspects, when one side of the source inlets 1006 may be clogged, the arc may not operate. This may be due to gradients in the gas flow making the discharge medium less uniform and unstable.

Figures 7A, 7B:
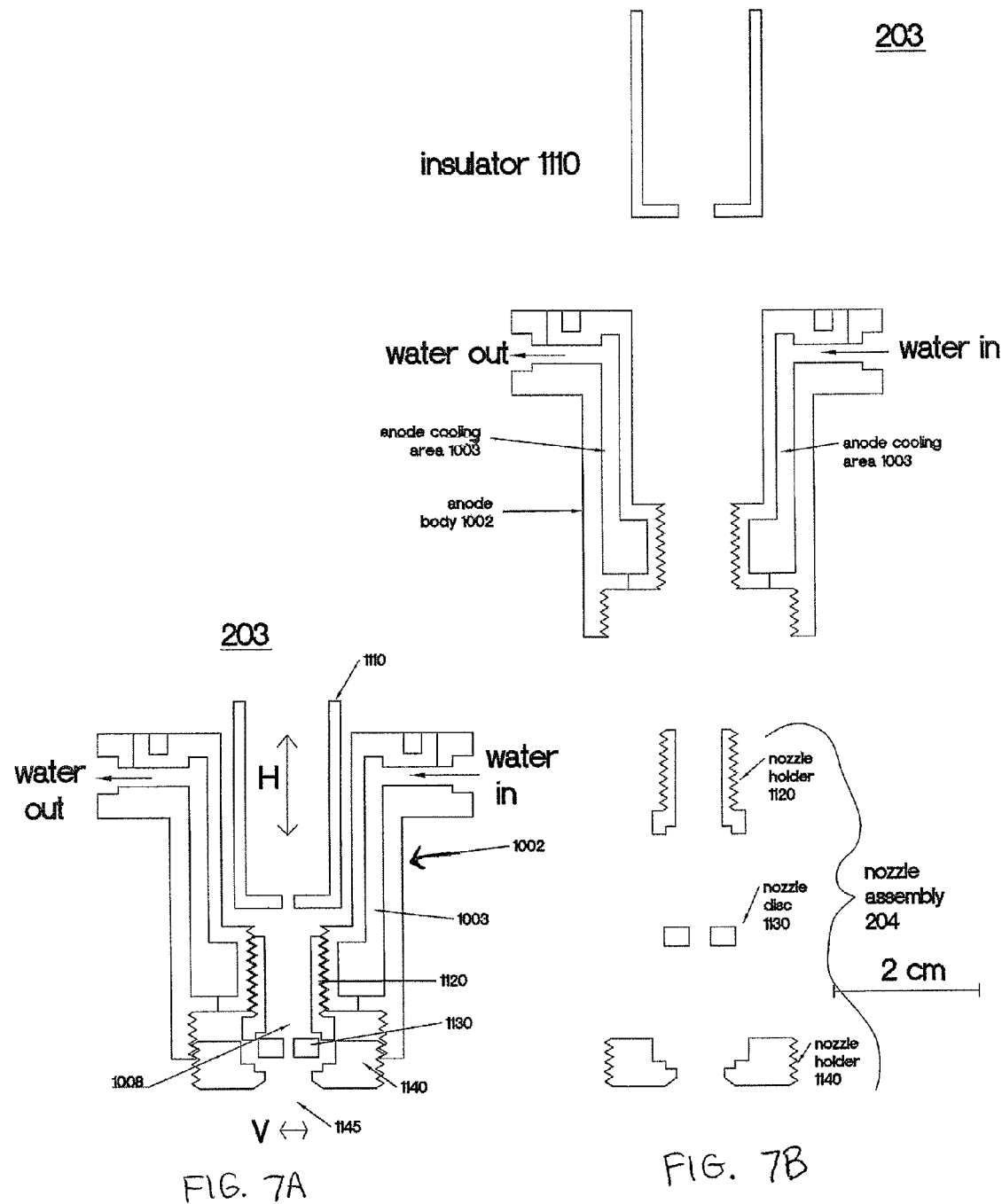
FIG. 7A illustrates an anode assembly, in accordance with one aspect of the subject disclosure.
FIG. 7B illustrates an exploded view of an anode assembly, in accordance with one aspect of the subject disclosure.

FIG. 7A illustrates anode assembly 203 as assembled, while FIG. 7B illustrates an exploded view of anode assembly 203, in accordance with various aspects of the subject disclosure. Nozzle assembly 204 may comprise one or more nozzle holders (e.g., 1120 and 1140) and a nozzle disc 1130. The one or more nozzle holders may hold nozzle disc 1130. The one or more nozzle holders may be made of, for example and without limitation, copper, brass, stainless steel, or other suitable materials. Nozzle disc 1130 may be made of, for example and without limitation, tungsten or other suitable materials that can withstand very high temperatures (e.g., exceeding about 3500° K). In some aspects, nozzle disc 1130 may be easily replaceable or removable. Nozzle assembly 204 may create an aperture 1145 through which a hyperthermal beam may be emitted from plasma discharge source 200 into intermediary chamber 117 of FIG. 2A. In some aspects, anode body 1002 may be made of, for example and without limitation, copper, brass, stainless steel, or other suitable materials. Insulator 1110 may be made of, for example and without limitation, ceramic or other suitable materials for insulating at least a portion(s) of anode assembly 203 from at least a portion(s) of cathode assembly 202. In one aspect, insulator 1110 may be a solid, and not a hollow space (e.g., it is not area 1004).

In some aspects, anode body 1002 may have multiple water cooling channels bored into it. For example, anode body 1002 may have six water cooling channels bored into it. The front of anode assembly 203 may hold nozzle assembly 204 through which the elemental source passes and to which the arc is struck. Once the arc is struck between the cathode tip of cathode rod 1010 and nozzle disc 1130, the arc may migrate to anode body 1002 creating an internal arc, which may subsequently cause damage to plasma discharge source 200. According to various aspects of the subject disclosure, in order to circumvent this problem, anode assembly 203 of plasma discharge source 200 may be electrically insulated from cathode assembly 202 everywhere except at the exit point (e.g., nozzle disc 1130) of nozzle assembly 204. In some aspects, this may entail machining a piece of Macor ceramic 1110, which resembles a pair of coaxial cylinders with different diameters. The small diameter cylinder of insulator 1110 may surround cathode rod 1010 and the larger diameter may surround the cathode tube 1101 which may hold cathode rod 1010. As a result, cathode assembly 202 may be shielded from anode assembly 203, confining the arc to the small volume between the tip of cathode rod 1010 and nozzle disc 1130.

According to various aspects of the subject disclosure, since much heat may be generated at or near the exit aperture of nozzle assembly 204, nozzle disc 1130 may be designed for easy replacement. For example, a 1 mm hole may be drilled at the center of a 0.125" thick by 0.375" in diameter disk made of tungsten. The nozzle disc 1130 may be held in place by one or more nozzle holders (e.g., 1120 and 1140), which may provide excellent thermal contact between the nozzle disc 1130 and the water-cooled base of anode body 1002.

Referring to FIGS. 4, 5, 7A, and 7B, anode assembly 203 and cathode assembly 202 may be joined by screws, in accordance with various aspects of the subject disclosure. For example, anode assembly 203 and cathode assembly 202 may be joined by six Teflon screws. In some aspects, the screws may be inserted into screw holes 280 (FIG. 5) in order to join anode assembly 203 and cathode assembly 202 together. In some aspects, screw holes 280 may be Teflon screw holes. In some aspects, anode assembly 203 and cathode assembly 202 may be electrically separated by a spacer (e.g., a Teflon spacer) and an O-ring 1005 (FIG. 4) (e.g., a Viton O-ring). O-ring 1005 may also provide a vacuum seal between anode assembly 203 and cathode assembly 202. Once the anode assembly 203 and cathode assembly 202 are assembled together, the space between the cathode tip of cathode rod 1010 and nozzle assembly 204 forms an area 1004 (FIG. 4) (e.g., a small chamber) into which one or more elemental sources (e.g., in a form of gas) may be introduced via source inlet lines such as source inlets 1006. To ensure that cathode assembly 202 may be insulated from the rest of source chamber 100 (e.g., anode assembly 203), all water lines to cathode assembly 202 may be made of polyethylene tubing, plastic tubing, or other suitable non-conductive materials. Source inlets 1006 may contain glass spacers to insulate it as well from anode assembly 203 and the rest of source chamber 100.

According to various aspects of the subject disclosure, when anode assembly 203 and cathode assembly 202 are assembled, the separation distance 220 (FIG. 4) can be adjusted by compressing compression member 1007, measuring the distance from the tip of cathode rod 1010 to the threaded nozzle holder 1120 with nozzle disc 1130 removed with a set of calipers, and fixing cathode assembly 202 in place at the appropriate location with screws, such as Teflon retainer screws, inserted at screw holes 280. In one aspect of the disclosure, separation distance 220 (i.e., the gap between the tip of the cathode rod 1010 (facing nozzle disc 1130) and the surface of nozzle disc 1130 (facing the tip)) may be between about 0.4 to 0.8 mm. In one advantageous aspect, separation distance 220 may be about 0.5 mm. In some aspects, if separation distance 220 is too small, the nozzle aperture may immediately short out to cathode rod 1010. However, if separation distance 220 is too large, the arc may extinguish during any changeover from a first elemental source to a different elemental source. For example, the arc may extinguish during a changeover from a carrier gas (e.g., argon) to service gas (e.g., hydrogen). In some aspects, a separation distance 220 of about 0.4 to 0.8 mm may provide stable operation of hyperthermal beam system 10.

Referring to FIGS. 1, 2A, 4 and 7A, a tip of cathode rod 1010 may move, along horizontal axis H, past insulator 1110, where the tip of cathode rod 1010 may be adjacent to and/or surrounded by nozzle holder 1120. An arc may be formed between a tip of cathode rod 1010 and nozzle assembly 204 at arc area 1008 (FIGS. 4 and 7A), in accordance with various aspects of the subject disclosure. Arc area 1008 may be a location at or near an aperture in nozzle assembly 204. In some aspects, arc area 1008 may be a location within plasma discharge source 200 immediately in front of the exit point of plasma discharge source 200 (e.g., aperture in nozzle assembly 204). In one example, separation distance 220 may be set, and an arc may be formed at arc area 1008 between cathode rod 1010 and nozzle assembly 204. Because first vacuum system 1040 may create a pressure differential where the pressure external to plasma discharge source 200 is less than a pressure within plasma discharge source 200, the elemental source received through source inlets 1006 may move towards arc area 1008, causing the elemental source to pass through the arc. As a result, the elemental source may dissociate into ions, generating a plasma flame at arc area 1008. In one aspect, the ions of the plasma may be converted into neutral atoms at area 1008, by collision momentum transferring neutralization and reflection of impinging ions at the dissociation chamber surface.

According to various aspects of the subject disclosure, magnetic source 102 may provide a magnetic field which may radially compress (e.g., along vertical axis V as shown in FIGS. 2A, 4 and 7A) the plasma in arc area 1008 (e.g., where the plasma flame may be generated) and/or nozzle assembly 204 to minimize or prevent contact between the plasma flame and the surrounding walls of nozzle assembly 204 (e.g., nozzle holders 1120 and 1140).

According to aspects of the subject disclosure, a variable current arc welder supply may be used to power plasma discharge source 200. For example, referring to FIG. 2A, power may be transmitted to plasma discharge source 200 via one or more conflate feed-throughs 109. In some aspects, the maximum current supplied to plasma discharge source 200 may be about 200 amperes. In some aspects, the open circuit voltage supplied to plasma discharge source 200 may be about 90 Volts DC (VDC). Furthermore, a DC ammeter may be used to monitor the current and a DC voltmeter may be used to monitor the output voltage. In some aspects, the ammeter may be a 0 to 300 Ampere DC (ADC) meter and the voltmeter may be a 0 to 150 VDC meter. These are merely examples, and the subject technology is not limited to these examples.

Figure 8:
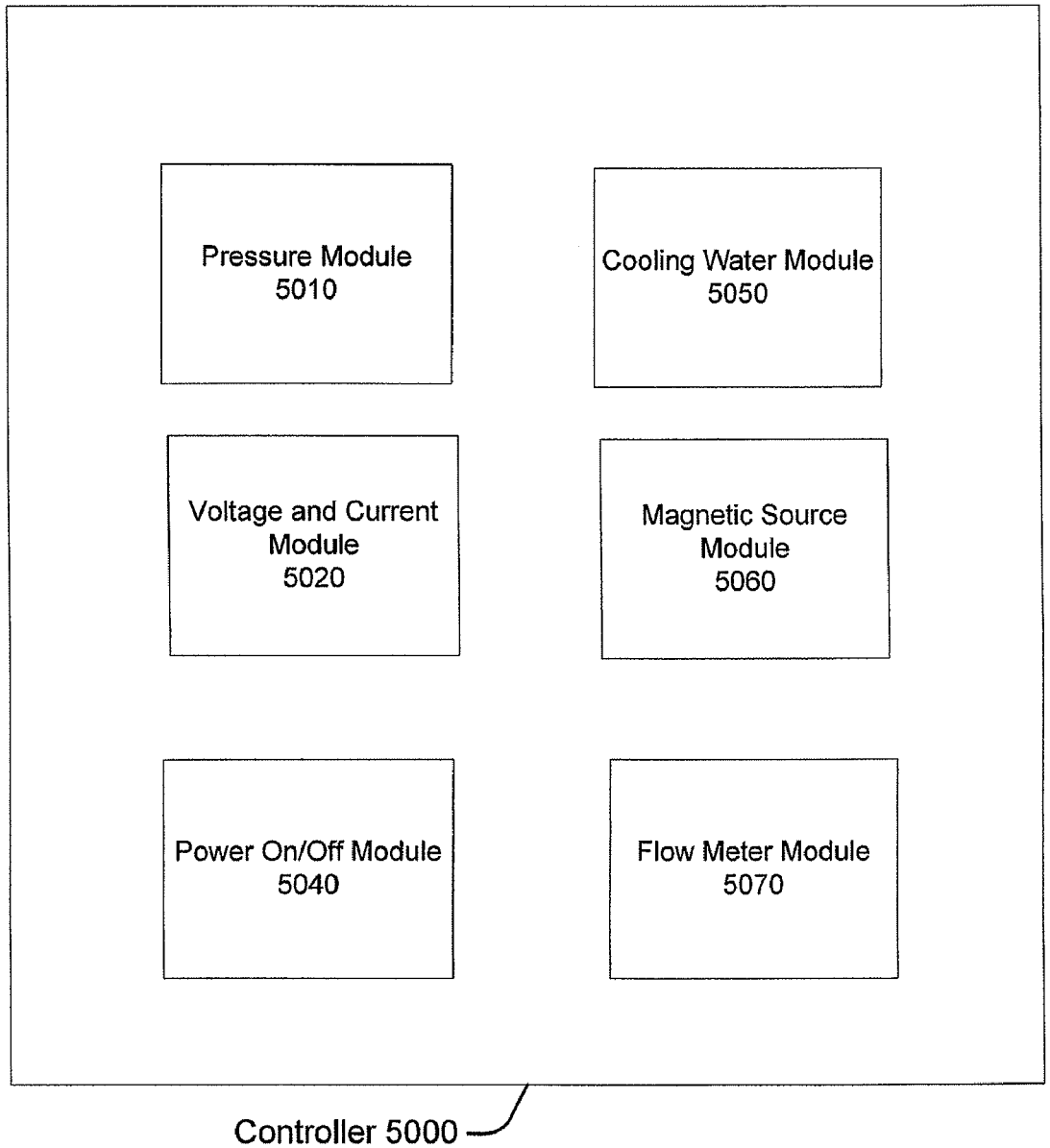
FIG. 8 illustrates an example of a controller, in accordance with one aspect of the subject disclosure.

FIG. 8 illustrates an example of controller 5000, in accordance with one aspect of the subject disclosure. Controller 500 may be, for example, a computer. Controller 5000 may monitor hyperthermal beam system 10 and ensure that the various functions and processes associated with hyperthermal beam system 10 are working correctly. In some aspects, controller 5000 may be configured to monitor water flow, gas flow, temperature, or pressure throughout hyperthermal beam system 10. Controller 5000 may shut down or prevent from turning on all or parts of hyperthermal beam system 10 (e.g., by cutting off the power provided to various components of hyperthermal beam system 10) if a water leak is detected, if a gas leak is detected, if the temperature is beyond a suitable operating temperature range, or if the pressure is beyond a suitable operating pressure range.

Although not shown in FIGS. 1 and 8, controller 5000 may be connected to various parts of or the entire hyperthermal beam system 10. In one example, controller 5000 may control (e.g., provide control signals, receive output signals by monitoring) some or all of the components shown in FIG. 1. For example, controller 5000 may be connected to mechanical pump 1020, booster pump 1030, main diffusion pump 1000, source chamber 100, diagnostics chamber 2000, gate valve 3040, trap 3030, baffle 3020 and pump 3010.

In one aspect, controller 5000 may comprise pressure module 5010, voltage and current module 5020, power on/off module 5040, cooling water module 5050, magnetic source module 5060, and flow meter module 5070. Parts of the modules can be implemented in software, hardware and/or a combination of both. Features and functions of these modules according to various aspects are further described in the present disclosure.

In some aspects, pressure module 5010 may monitor the pressure of certain chambers of hyperthermal beam system 10. Pressure module 5010 may also monitor the pressure that each pump of hyperthermal beam system 10 is exerting or creating. For example, pressure module 5010 may monitor the pressure in mechanical pump 1020, main diffusion pump 1000, source chamber 100, or even a working area chamber 2012 where the hyperthermal beam is being used for various purposes. In one configuration, working area chamber 2012 is not part of hyperthermal beam system 10, but rather a unit that may be attached to hyperthermal beam system 10. In another configuration, working area chamber 2012 is part of hyperthermal beam system 10. If pressure module 5010 determines that the pressure in a chamber is beyond a suitable operating pressure range, then pressure module 5010 may communicate with power on/off module 5040 to shut down or prevent from turning on the related operation until the pressure is corrected. For example, pressure module 5010 may monitor the pressure in source chamber 100 and if the pressure is beyond a suitable operating pressure range (e.g., the detected pressure may be greater than about $10^{-4}$ torr), then pressure module 5010 may communicate with power on/off module 5040 to shut off or prevent plasma discharge source 200 from operating until the pressure is adjusted appropriately.

In some aspects, voltage and current module 5020 may monitor the voltage and/or current throughout hyperthermal beam system 10 and control the amount of voltage and/or current supplied to hyperthermal beam system 10. For example, voltage and current module 5020 may monitor the amount of voltage and/or current in plasma discharge source 200 or magnetic source 102, and adjust or supply an appropriate amount of voltage and/or current to plasma discharge source 200 or magnetic source 102 in order to control the translational energy or intensity of the hyperthermal beam. In some aspects, a user may utilize controller 5000 to set or change the desired translational energy or intensity of the hyperthermal beam by adjusting the voltage and/or current supplied to plasma discharge source 200 or magnetic source 102.

Cooling water module 5050 may monitor the amount of cooling water currently being used in hyperthermal beam system 10. Cooling water module may also control how much cooling water may be needed or when cooling water may be needed to cool certain parts of hyperthermal beam system 10. In some aspects, cooling water module 5050 may monitor the temperature of certain parts of hyperthermal beam system 10 to determine if cooling water is needed to cool the particular part. For example, if cooling water module 5050 detects that the temperature of cathode assembly 202 is relatively high, then cooling water module 5050 may allow for more water to enter cathode cooling area 1009 in order to cool cathode assembly 202.

If cooling water module 5050 determines that the temperature in a chamber is beyond a suitable operating temperature range, then cooling water module 5050 may communicate with power on/off module 5040 to shut down or prevent from turning on the related operation until the temperature is corrected. For example, cooling water module 5050 may monitor the temperature in source chamber 100 and if the temperature is beyond a suitable operating temperature range (e.g., the detected temperature is greater than about 500° K), then cooling water module 5050 may communicate with power on/off module 5040 to shut off or prevent plasma discharge source 200 from operating until the temperature is adjusted appropriately.

Magnetic source module 5060 may monitor the magnetic field of magnetic source 102 and control the magnetic field by communicating with voltage and current module 5020 to supply more or less voltage and/or current to magnetic source 102. Magnetic source module 5060 may also determine the magnetic field required to produce a certain size of the hyperthermal beam.

Flow meter module 5070 may monitor the flow of any pipes and/or lines throughout hyperthermal beam system 10. For example, flow meter module 5070 may monitor the flow of gases or liquids throughout hyperthermal beam system 10. In some aspects, flow meter module 5070 may monitor the water flow throughout the water lines in hyperthermal beam system 10 to detect if there are any leaks within hyperthermal beam system 10. For example, flow meter module 5070 may monitor the amount of water entering hyperthermal beam system 10 as well as the amount of water exiting hyperthermal beam system 10. If the amount of water exiting is less than the amount of water entering, then a leak may be detected. In some aspects, flow meter module 5070 may also monitor source inlets 1006, area 1004, or other areas of hyperthermal beam system 10 to determine if there are any gas leaks. If flow meter module 5070 detects any water leaks or gas leaks, then flow meter module 5070 may communicate with power on/off module 5040 to shut down or prevent from turning on the related operation until the water leak or gas leak is corrected.

Power on/off module 5040 may shut down power to all or parts of hyperthermal beam system 10 should any unsafe conditions be detected by any of the modules within controller 5000. Power on/off module 5040 may subsequently provide power to all or parts of hyperthermal beam system 10 should the unsafe conditions be remedied. For example, to protect the various vacuum pumps from damage or accidental misuse, an interlock-control system (e.g., controller 5000) may be used to protect hyperthermal beam system 10. Controller 5000 may be designed to shut off the beam power source or any of the pumps if any failures occur in the other components of hyperthermal beam system 10. In some aspects, each stage of the interlock may be enabled only when the proceeding stage is made operational.

According to various aspects of the subject disclosure, controller 5000 may first monitor the proper functioning of mechanical pump 1020. Once mechanical pump 1020 is on and water is flowing through main diffusion pump 1000, then the heater power for its diffusion pumps may be turned on. Power on/off module 5040 (e.g., a thermal cut-out switch and an over-pressure switch) may be provided to protect main diffusion pump 1000 and switch off the heater power should either condition occur. In some aspects, the pressure sensor used may be a Schulz-Phelps gauge and controller. In some aspects, only after mechanical pump 1020 and main diffusion pump 1000 are on can the plasma discharge source 200 power be turned on.

Within source chamber 100, there may be multiple separate water-cooling lines. In some aspects, the water-cooling lines comprise polyethylene tubing or other suitable types of non-conductive material. In some aspects, there may be two separate water-cooling lines, where one line cools only the anode assembly 203 and cathode assembly 202 of plasma discharge source 200 (e.g., by supplying cooling water to anode cooling area 1003 and cathode cooling area 1009). The second line may cool the center of magnetic source 102, which may hold plasma discharge source 200, then may cool the magnetic source 102 itself, and finally the aluminum base of skimmer 103. To prevent water leak and minimize accidents, the flow out of both water lines may be monitored by flow meter module 5070 (e.g., McDonnell flow switches). When flow drops, either due to a leak in hyperthermal beam system 10 or a drop in the total flow of water, an alarm may sound, thus triggering the interlock-control system discussed above. Plasma discharge source 200 may then be shut off, as well as the other diffusion pumps, by shutting off the power provided to these components.

Figure 9:
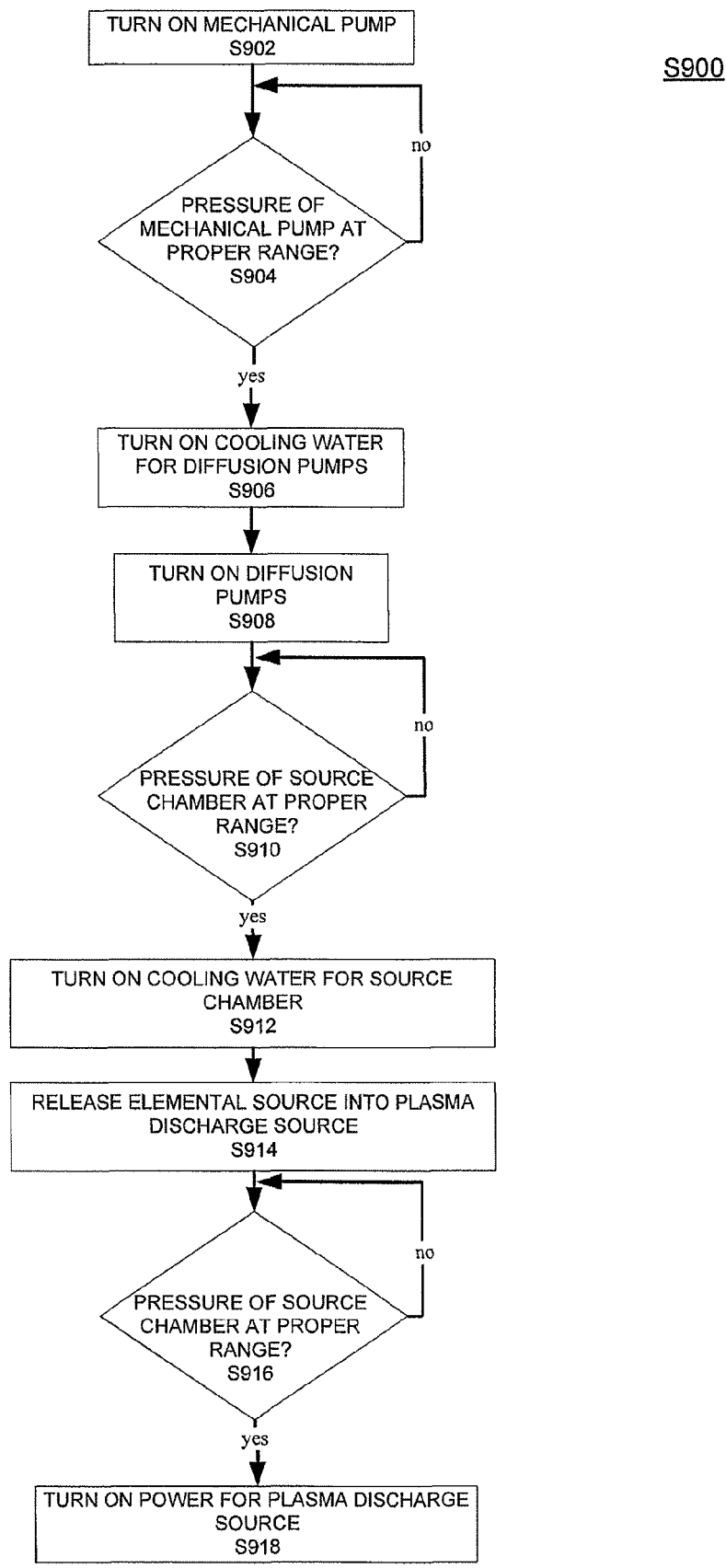
FIG. 9 illustrates a method of operation of an interlock-control system, in accordance with one aspect of the subject disclosure.

FIG. 9 illustrates a method S900 of operation of the interlock-control system, in accordance with one aspect of the subject disclosure. Referring to FIGS. 1 and 9, at process S902, mechanical pump 1020 may be turned on. At process S904, mechanical pump 1020 may be checked for proper operation. For example, the pressure of mechanical pump 1020 may be compared to a suitable pressure range for operation of hyperthermal beam system 10. Once mechanical pump 1020 has generated a pressure that is suitable, then at process S906, water flow may be turned on to flow to diffusion pumps (e.g., main diffusion pump 1000 and booster pump 1030). At process S908, the diffusion pumps may be turned on.

The pressure throughout hyperthermal beam system 10 may be monitored. For example, at process S910, the pressure in source chamber 100 may be monitored. If the pressure in source chamber 100 is at a suitable level (e.g., less than $10^{-4}$ torr), then, at process S912, cooling water may be turned on for source chamber 100. The cooling water may be used to cool plasma discharge source 200, magnetic source 102, skimmer 103, or other components within source chamber 100. At process S914, the elemental source may then be released into plasma discharge source 200, for example, via feed-through 109b. Various gases, such as argon or hydrogen, may be released via feed-through 109b into plasma discharge source 200. At process S916, the pressure within source chamber 100 may be monitored again to determine if the pressure within plasma discharge source 200 is within a suitable range for operation of hyperthermal beam system 10. If so, then at process S918, the power for plasma discharge source 200 may be turned on in order to produce the hyperthermal beam.

The following is a description of an example of generating a hyperthermal beam, in accordance with one aspect of the subject disclosure. With reference to FIG. 2A, plasma discharge source 200 may receive an elemental source. In some aspects, an elemental source may comprise only one element. In some aspects, an elemental source may comprise more than one element. In this example, the elemental source that the hyperthermal beam is generated from may be hydrogen (e.g., hydrogen molecules). Any attempt to start the discharge in pure hydrogen gas may damage or destroy plasma discharge source 200 and anything within its vicinity due to melting. According to various aspects of the subject disclosure, a safe, reliable way to generate a hydrogen beam is first to start the plasma with a different elemental source and then gradually switch over to hydrogen. For example, the different elemental source may be an element from the noble gases. Argon, because of its relative abundance and low cost, may be used as the initial elemental source. After allowing the chambers (e.g., source chamber 100) to pump down, a flow of argon (e.g., argon molecules) may be established. In some aspects, the flow may be regulated by a leak valve until a constant flow of about 5 standard cubic feet per hour (SCFH) air, as measured by a flow meter on source inlet 1006 line, is achieved. In some aspects, for a typical nozzle, this corresponds to a stagnation pressure of about 340 torr as measured by the pressure gauge on source inlet 1006 line. At this point, the pressure of diagnostics chamber 2000 may be lowered to about 50 microns (or $50*10^{-3}$ torr), while the pressure in source chamber 100 may be lowered to about $10^{-4}$ torr. The water lines for plasma discharge source 200, magnetic source 102, skimmer 103, and the exterior of source chamber 100 (e.g., source chamber outer wall 104) may then be turned on, and the pressure may be carefully monitored to verify whether there are any minor water leaks within source chamber 100. Once the gas pressure has stabilized, the current to magnetic source 102 and to the arc welder may be turned on. The portion of the secondary winding tap of the welder's power supply controlled by the servo-motor and/or controller 5000 may be set to a position which may produce a 100 ampere current once the arc strikes. The argon arc may now be initiated by throwing the switch on the starter which may provide the voltage pulse between anode assembly 203 and cathode assembly 202, initiating the discharge. Should the discharge successfully commence, the welder may supply about 15 volts and about 100 amperes. A stable intense light blue plume may be observed.

According to various aspects of the subject disclosure, once the discharge appears stable, hydrogen gas may slowly be mixed into the argon flow. The gas may be introduced into hyperthermal beam system 10 via a variable leak valve (e.g., via feed-through 109b). No visible change may appear in the plasma until approximately 24 torr partial pressure of hydrogen has been introduced. At this time, there may be a dramatic change in the appearance of the plume. For example, it may become much reduced in size and turn into a less intense but beautiful crimson red color. The hydrogen flow may be continuously increased until the hydrogen pressure reaches about 150 torr. The intensity of the plasma emission may continue to decrease as the hydrogen flow increases.

According to various aspects of the subject disclosure, once the hydrogen pressure has been reached, the argon flow may slowly be turned off, which unless otherwise modified may result in a decrease of the arc current and an increase in its voltage. In some aspects, during this changeover, the current may need to be kept at a constant value of about 100 amperes or the discharge may be extinguished. This may be accomplished by changing, via the servo motor and/or controller 5000, the position of the welder's secondary winding tap. During this decrease in the argon flow the emission may become progressively brighter while the cooling water may become progressively hotter.

Once the argon flow has been turned off and the electric current and hydrogen gas flow have stabilized, a brilliant diffuse crimson red plume may now be observed at about 150 torr stagnation pressure. Once the beam is in this mode, a high flux of hydrogen atoms may be observed. Under these conditions, the beam may become quite stable and may be run indefinitely in this present mode.

One method of detection of the neutral species in the beam produced by the arc discharge may be by mass spectroscopy, performed for example by diagnostic devices of diagnostics chamber 2000. A device that may be used is an EAI Quad 300 residual gas analyzer, which may ionize and mass analyze any species which may enter the ionizing region. The device assembly may perform the function of ionizing, mass filtering and ion detection. An estimate of the total neutral atomic beam intensity may be made by measuring the m/e=1 DC ion current to the electron multiplier detector of the quadruple mass spectrometer. This may be done with the mass spectrometer operating in the manual mode and tuned to the mass peak of interest. Either turning off the peak and noting the drop in intensity, or inserting a mechanical flag into the path of the beam corrected for background. The intensity of the hydrogen molecules in the beam may be small and does not significantly contribute to the observed m/e=1 ion current. The translational energy distribution function of these hydrogen atoms may be measured by retardation potential measurement and may extend to energies greater than 20 eV. From the operating parameters, what may be obtained is a current of neutral hydrogen atoms into the ionizer of the mass spectrometer of $$I_H = (\pi v d)/(4\sigma) \cdot (I_+/I_e) = 9.0 \times 10^{16} \text{ H-atoms/sec}$$

where $I_+$ is the measured ion current (m/e=$1.5 \times 10^{-10}$ A), d is the diameter of the neutral beam in the ionizer region (3.2 mm), $I_e$ is the electron beam current (70µ amp), $I_e$ is the electron beam energy (80 eV), v is the average velocity of the hydrogen atoms ($3.9 \times 10^6$ cm/sec), and $\sigma$ is the cross section for ionization of the hydrogen atoms by electron impact ($0.66 \times 10^{-16}$ cm$^2$). In one example, the resulting hydrogen atom beam flux per unit solid angle is $1.3 \times 10^{22}$ hydrogen atoms/sterad/sec. Fluxes of this order of magnitude may be systematically obtained.

Figure 10:
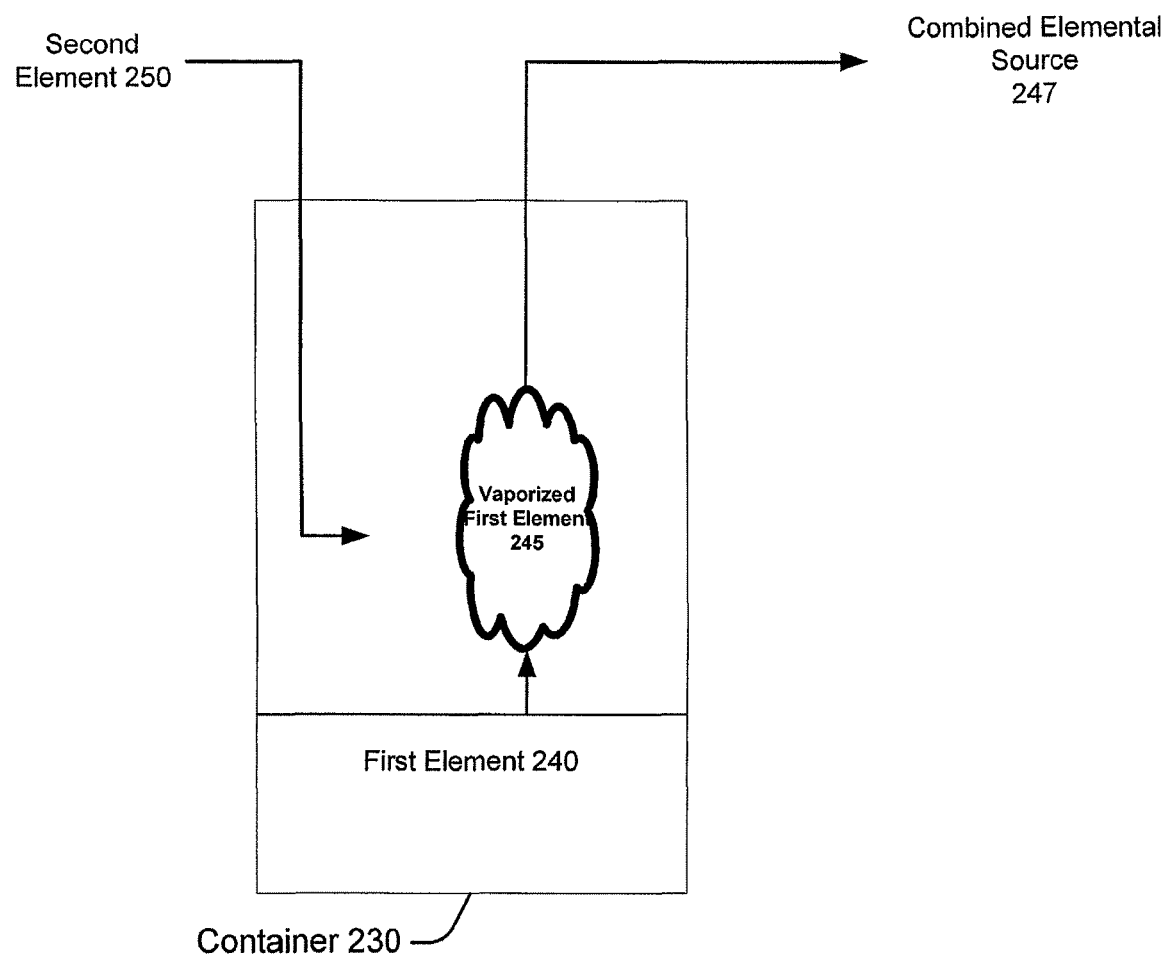
FIG. 10 illustrates an example of producing a hyperthermal beam, in accordance with one aspect of the subject disclosure.

FIG. 10 illustrates another example of producing a hyperthermal beam, in accordance with one aspect of the subject disclosure. As discussed above, plasma discharge source 200 may receive an elemental source. In this example, the elemental source received by plasma discharge source 200 may comprise more than one element. In some aspects, these elements may be elements selected from alkali metals, alkali earth group metals, hydrogen and/or noble gases. For example, first element 240 may be an element from alkali metals or alkali earth group metals. First element 240 may be placed in container 230, which may then be heated to produce vaporized first element 245. The temperature needed to vaporize first element 240 may depend on what element it is. For example, first element 240 may be sodium (Na). Container 230 may then be heated to obtain a temperature greater than or equal to about 500° Celsius to vaporize Na. Second element 250 may then be added into container 230 such that second element 250 is mixed with vaporized first element 245 to produce combined elemental source 247. Second element 250, for example, may be a noble gas such as argon. Combined elemental source 247, therefore, may comprise second element 250 and vaporized first element 245 (e.g., sodium and argon). In some aspects, combined element source 247 may then be received by plasma discharge source 200 to produce a hyperthermal beam according to the techniques described above.

In accordance with various aspects of the subject disclosure, an apparatus to produce intense hyperthermal beams of neutral atoms of an alkali metal, an alkali earth group metal, or hydrogen is provided. In some aspects, the beam apparatus may comprise a vacuum system and a stable plasma discharge source. The vacuum system may be capable of having a high pumping speed at a relatively high pressure. The stable plasma discharge source may dissociate the molecules into atoms. The beam apparatus may also comprise means to allow a carrier gas (e.g., argon) into the plasma discharge source to start the plasma. The beam apparatus may also comprise means to pass a source gas (e.g., hydrogen) into the plasma discharge source, switching over from the carrier gas. The beam apparatus may also comprise means to focus and collimate the beams.

Figure 11:
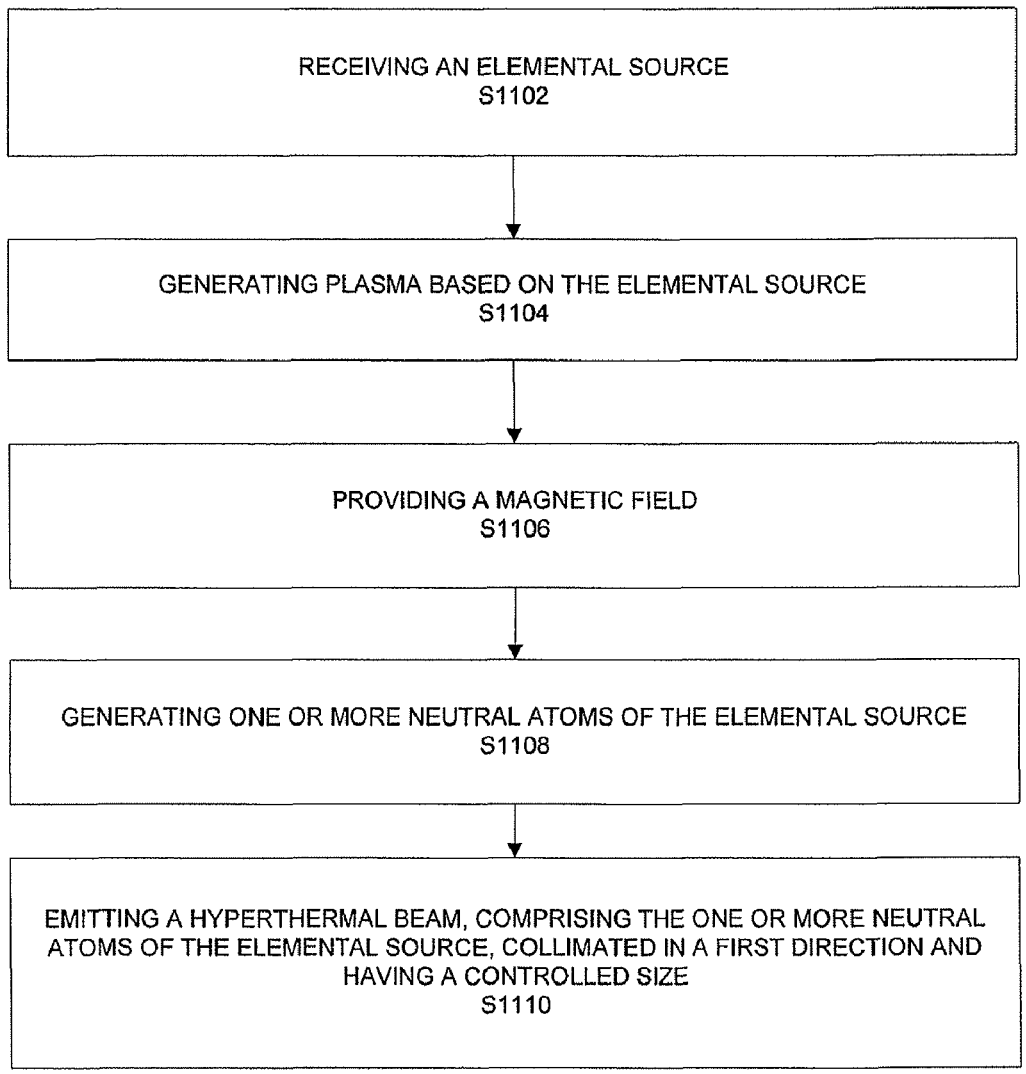
FIG. 11 illustrates a method for producing a hyperthermal beam, in accordance with one aspect of the subject disclosure.

FIG. 11 illustrates a method S1100 for producing a hyperthermal beam, in accordance with one aspect of the subject disclosure. Method S1100 may comprise receiving an elemental source (S1102) and generating plasma based on the elemental source (S1104). Method S1100 may also comprise providing a magnetic field (S1106) and generating one or more neutral atoms of the elemental source (S1108). Method S1100 may also comprise emitting a hyperthermal beam, comprising the one or more neutral atoms of the elemental source, collimated in a first direction and having a controlled size (S1110).

Figure 12:
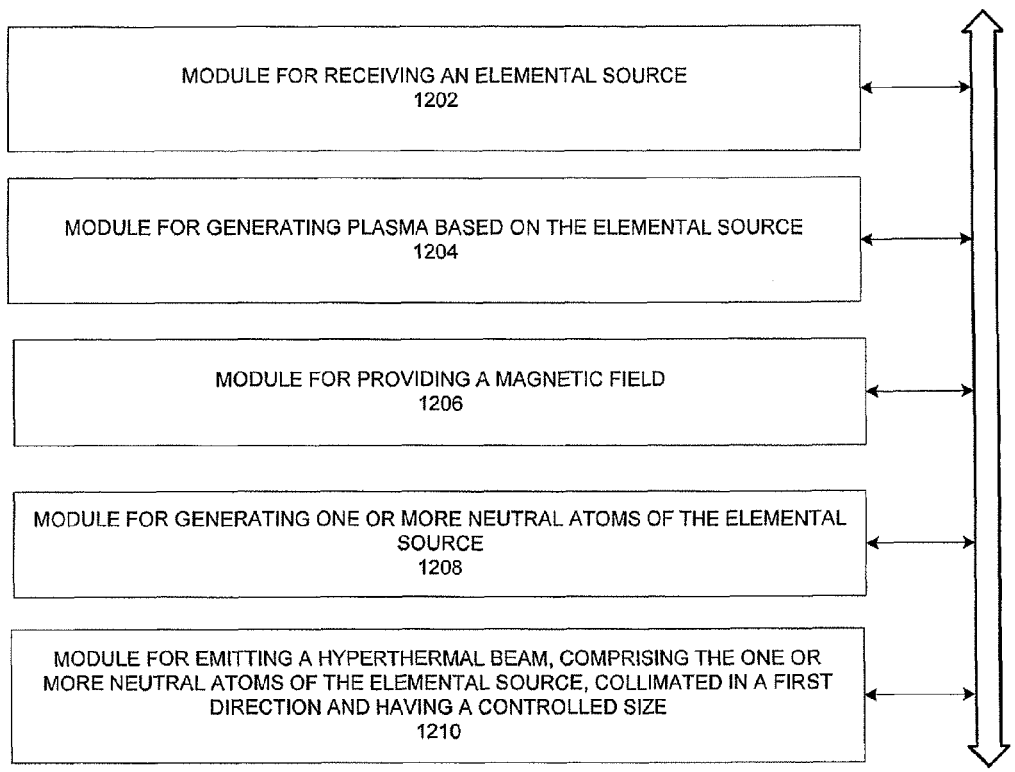
FIG. 12 illustrates an example of a configuration of an apparatus for producing a hyperthermal beam, in accordance with one aspect of the subject disclosure.

FIG. 12 illustrates an example of a configuration of an apparatus 1200 for producing a hyperthermal beam, in accordance with one aspect of the subject disclosure. Apparatus 1200 may comprise a module for receiving an elemental source (1202) and a module for generating plasma based on the elemental source (1204). Apparatus 1200 may also comprise a module for providing a magnetic field (1206) and a module for generating one or more neutral atoms of the elemental source (1208). Apparatus 1200 may also comprise a module for emitting a hyperthermal beam, comprising the one or more neutral atoms of the elemental source, collimated in a first direction and having a controlled size (1210).

The foregoing description is provided to enable a person skilled in the art to practice the various configurations described herein. While the present invention has been particularly described with reference to the various figures and configurations, it should be understood that these are for illustration purposes only and should not be taken as limiting the scope of the invention.

Those of skill in the art would appreciate that the various illustrative blocks, modules, elements, components, methods, and algorithms described herein may be implemented as electronic hardware, computer software, or combinations of both. For example, controller 5000 of FIG. 8 may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology. For example, the specific orders of method S900 of FIG. 9 or method S1100 of FIG. 11 may be rearranged, and some or all of modules or components shown in various figures (e.g., FIGS. 1, 2A, 2B, 2C, 3A, 4, 5, 7A, 7B, 8, 10 and 12) may be partitioned or arranged in different ways.

The subject technology is illustrated, for example, according to various aspects described below. Numbered clauses are provided below for convenience. These are provided as examples, and do not limit the subject technology.

1. An apparatus for producing a hyperthermal beam, comprising:
a plasma discharge source configured to receive an elemental source, generate plasma based on the elemental source, and generate one or more neutral atoms of the elemental source;
an emission system configured to emit a hyperthermal beam, comprising the one or more neutral atoms of the elemental source, from the plasma discharge source through an aperture of the plasma discharge source; and
a magnetic source configured to provide a magnetic field and to collimate the hyperthermal beam in a first direction and control a size of the hyperthermal beam.

2. The apparatus of clause 1, wherein the elemental source comprises one or more of an alkali metal, an alkali earth group metal, hydrogen, or a noble gas.

3. The apparatus of clause 1, wherein the elemental source comprises argon molecules and hydrogen molecules, wherein the plasma discharge source is configured to start receiving the argon molecules before starting to receive the hydrogen molecules, and wherein the one or more neutral atoms comprise neutral hydrogen atoms.

4. The apparatus of clause 1, wherein the elemental source comprises a first elemental source and a second elemental source, wherein the plasma discharge source is configured to generate the plasma based on the second elemental source, the first elemental source, or the second elemental source and the first elemental source, wherein a weight of the second elemental source is less than a weight of the first elemental source, wherein the first elemental source comprises a noble gas, and wherein the second elemental source comprises an alkali metal or an alkali earth group metal.

5. The apparatus of clause 1, wherein the plasma discharge source comprises one or more source inlets configured to receive the elemental source, wherein the one or more source inlets are angled substantially tangential to a wall of the plasma discharge source to allow the plasma discharge source to receive the elemental source in a swirl-like distribution.

6. The apparatus of clause 1, wherein the plasma discharge source comprises an anode assembly and a cathode assembly, wherein the anode assembly comprises a nozzle assembly, an anode body and an insulator, wherein the cathode assembly comprises a cathode rod, a cathode body and one or more compression members attached to the cathode rod, wherein the one or more compression members are configured to compress or expand such that the cathode rod is configured to move relative to the anode assembly in a direction parallel to the first direction, wherein a separation distance between the nozzle assembly and a cathode tip of the cathode rod is adjustable based on movement of the cathode rod, wherein the insulator is adjacent to at least a portion of the cathode rod and is configured to electrically insulate the anode assembly from the at least a portion of the cathode rod adjacent to the insulator, wherein the cathode tip is not insulated from the nozzle assembly by the insulator, and wherein the plasma discharge source is further configured to generate a voltage pulse between the nozzle assembly and the cathode tip based on the separation distance.

7. The apparatus of clause 6, wherein the nozzle assembly comprises one or more nozzle holders and a nozzle disc, wherein the one or more nozzle holders are configured to hold the nozzle disc, wherein the one or more nozzle holders comprise copper, brass or stainless steel, wherein the nozzle disc comprises tungsten, wherein the nozzle disc is removable, wherein the anode body comprises copper, brass or stainless steel, wherein the insulator comprises ceramic, wherein the cathode body comprises copper, brass or stainless steel, wherein the cathode rod comprises 2% thoriated tungsten, and wherein the one or more compression members comprise one or more bellows or one or more springs.

8. The apparatus of clause 1, further comprising an intermediary chamber configured to receive the hyperthermal beam, wherein the emission system comprises: a vacuum system configured to pump down a pressure in an interior of the plasma discharge source and a pressure in the intermediary chamber; and one or more source inlets configured to introduce the elemental source into the interior of the plasma discharge source, and
wherein the emission system is configured to provide the pressure in the interior of the plasma discharge source to be higher than the pressure in the intermediary chamber to allow the hyperthermal beam to emit from the plasma discharge source.

9. The apparatus of clause 1, further comprising a diagnostics chamber and a skimmer aligned with the aperture, wherein the skimmer is configured to focus the hyperthermal beam, wherein the diagnostics chamber comprises a speed selector configured to select a translational energy of the hyperthermal beam, wherein the speed selector comprises one or more rotatable discs configured to allow a portion of the hyperthermal beam to pass through the one or more rotatable discs based on a rotational speed of the one or more rotatable discs and a size of a slit on the one or more rotatable discs, wherein the portion of the hyperthermal beam has the selected translational energy, and wherein the one or more rotatable discs comprise tungsten.

10. The apparatus of clause 1, further comprising a controller configured to control a current and a voltage applied to the magnetic source or the plasma discharge source, wherein the magnetic field is tunable based on the current and the voltage, wherein a translational energy of the hyperthermal beam is tunable based on the current and the voltage, wherein an intensity of the hyperthermal beam is tunable based on the current and the voltage, wherein the translation energy is between about 0.5 and 20 eV, and wherein the intensity is on the order of up to about $10^{22}$ atoms/sterad/sec.

11. The apparatus of clause 1, further comprising one or more water-cooling lines and a controller, wherein the one or more water-cooling lines are configured to cool the plasma discharge source and the magnetic source, wherein the one or more water-cooling lines comprise polyethylene tubing, wherein the controller is configured to monitor water flow, gas flow, temperature, or pressure of the apparatus, wherein the controller is further configured to shut down or prevent from turning on the apparatus if a water leak is detected, if a gas leak is detected, if the temperature is beyond a suitable operating temperature range, or if the pressure is beyond a suitable operating pressure range.

12. A method for producing a hyperthermal beam, comprising:
receiving an elemental source;
generating plasma based on the elemental source;
providing a magnetic field;
generating one or more neutral atoms of the elemental source; and
emitting a hyperthermal beam, comprising the one or more neutral atoms of the elemental source, collimated in a first direction and having a controlled size.

13. The method of clause 12, wherein the elemental source comprises one or more of an alkali metal, an alkali earth group metal, hydrogen, or a noble gas.

14. The method of clause 12, wherein the elemental source comprises argon molecules and hydrogen molecules, wherein the argon molecules are initially received before starting to receive the hydrogen molecules, and wherein the one or more neutral atoms comprise neutral hydrogen atoms.

15. The method of clause 12, wherein the elemental source comprises a first elemental source and a second elemental source, wherein the generating the plasma comprises generating the plasma based on the second elemental source, the first elemental source, or the second elemental source and the first elemental source, wherein a weight of the second elemental source is less than a weight of the first elemental source, wherein the first elemental source comprises a noble gas, and wherein the second elemental source comprises an alkali metal or an alkali earth group metal.

16. The method of clause 12, wherein the receiving the elemental source comprises receiving the elemental source in a swirl-like distribution.

17. The method of clause 12, further comprising generating a voltage pulse between a nozzle assembly of an anode assembly and a cathode tip of a cathode rod based on a separation distance between the nozzle assembly and the cathode tip, wherein the anode assembly is electrically insulated from at least a portion of the cathode rod.

18. The method of clause 17, wherein the nozzle assembly comprises one or more nozzle holders and a nozzle disc, wherein the method further comprises holding the nozzle disc with the one or more nozzle holders, wherein the one or more nozzle holders comprise copper, brass or stainless steel, wherein the nozzle disc comprises tungsten, wherein the nozzle disc is removable, and wherein the cathode rod comprises 2% thoriated tungsten.

19. The method of clause 12, wherein the receiving comprises receiving the elemental source with a plasma discharge source, and wherein the method further comprises:
receiving the hyperthermal beam with an intermediary chamber;
pumping down a pressure in an interior of the plasma discharge source and a pressure in the intermediary chamber; and
providing the pressure in the interior of the plasma discharge source to be higher than the pressure in the intermediary chamber to allow the hyperthermal beam to emit from the plasma discharge source.

20. The method of clause 12, further comprising:
focusing the hyperthermal beam; and
selecting a translational energy of the hyperthermal beam.

21. The method of clause 12, further comprising controlling a current and a voltage applied to a magnetic source or a plasma discharge source, wherein the magnetic field is tunable based on the current and the voltage, wherein a translational energy of the hyperthermal beam is tunable based on the current and the voltage, wherein an intensity of the hyperthermal beam is tunable based on the current and the voltage, wherein the translation energy is between about 0.5 and 20 eV, and wherein the intensity is on the order of up to about $10^{22}$ atoms/sterad/sec.

22. The method of clause 12, further comprising cooling a plasma discharge source and a magnetic source with one or more water-cooling lines, wherein the one or more water-cooling lines comprise polyethylene tubing.

23. An apparatus for producing a hyperthermal beam, comprising:
means for receiving an elemental source;
means for generating plasma based on the elemental source;
means for providing a magnetic field;
means for generating one or more neutral atoms of the elemental source; and
means for emitting a hyperthermal beam, comprising the one or more neutral atoms of the elemental source, collimated in a first direction and having a controlled size.

24. The apparatus of clause 23, wherein the elemental source comprises one or more of an alkali metal, an alkali earth group metal, hydrogen, or a noble gas.

25. The apparatus of clause 23, wherein the elemental source comprises argon molecules and hydrogen molecules, wherein the means for receiving is configured to start receiving the argon molecules before starting to receive the hydrogen molecules, and wherein the one or more neutral atoms comprise neutral hydrogen atoms.

26. The apparatus of clause 23, wherein the elemental source comprises a first elemental source and a second elemental source, wherein the means for generating the plasma comprises means for generating the plasma based on the second elemental source, the first elemental source, or the second elemental source and the first elemental source, wherein a weight of the second elemental source is less than a weight of the first elemental source, wherein the first elemental source comprises a noble gas, and wherein the second elemental source comprises an alkali metal or an alkali earth group metal.

27. The apparatus of clause 23, wherein the means for receiving the elemental source comprises means for receiving the elemental source in a swirl-like distribution.

28. The apparatus of clause 23, further comprising means for electrically insulating an anode assembly from at least a portion of a cathode rod.

29. The apparatus of clause 23, further comprising:
means for receiving the hyperthermal beam;
means for pumping down a pressure in an interior of the means for receiving the elemental source and a pressure in the means for receiving the hyperthermal beam; and
means for providing the pressure in the interior of the means for receiving the elemental source to be higher than the pressure in the means for receiving the hyperthermal beam to allow the hyperthermal beam to emit from the means for receiving the elemental source.

30. The apparatus of clause 23, further comprising:
means for focusing the hyperthermal beam; and
means for selecting a translational energy of the hyperthermal beam.

31. The apparatus of clause 23, further comprising means for controlling a current and a voltage applied to the means for providing the magnetic field or the means for receiving the elemental source, wherein the magnetic field is tunable based on the current and the voltage, wherein a translational energy of the hyperthermal beam is tunable based on the current and the voltage, wherein an intensity of the hyperthermal beam is tunable based on the current and the voltage, wherein the translation energy is between about 0.5 and 20 eV, and wherein the intensity is on the order of up to about $10^{22}$ atoms/sterad/sec.

32. The apparatus of clause 23, further comprising:
means for cooling the means for receiving the elemental source and the means for providing the magnetic field;
means for monitoring water flow, gas flow, temperature, or pressure of the apparatus; and
means for shutting down or preventing from turning on the apparatus if a water leak is detected, if a gas leak is detected, if the temperature is beyond a suitable operating temperature range, or if the pressure is beyond a suitable operating pressure range.

There may be many other ways to implement the invention. Various functions and elements described herein may be partitioned differently from those shown without departing from the sprit and scope of the invention. Various modifications to these configurations will be readily apparent to those skilled in the art, and generic principles defined herein may be applied to other configurations. Thus, many changes and modifications may be made to the invention, by one having ordinary skill in the art, without departing from the scope of the invention. The claims are not intended to be limited to the aspects or configurations shown herein, but are to be accorded the full scope consistent with the language claims It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear," "horizontal," "vertical," and the like as used in this disclosure should be understood as referring to an arbitrary frame of reference, rather than to the ordinary gravitational frame of reference. Thus, a top surface, a bottom surface, a front surface, a rear surface, a horizontal direction, and a vertical direction may extend upwardly, downwardly, diagonally, or horizontally in a gravitational frame of reference.

A reference to an element in the singular is not intended to mean "one and only one" unless specifically stated, but rather "one or more." The term "some" may refer to one or more. In some aspects, the term "gas" as used herein may refer to one or more gases. In some aspects, the terms "hole," "nozzle" and "aperture" may be used interchangeably.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus for producing a hyperthermal beam, comprising:
a plasma discharge source configured to receive an elemental source, generate plasma based on the elemental source, and generate one or more neutral atoms of the elemental source;
an emission system configured to emit a hyperthermal beam, comprising the one or more neutral atoms of the elemental source, from the plasma discharge source through an aperture of the plasma discharge source;
a magnetic source configured to provide a magnetic field and to collimate the hyperthermal beam in a first direction and control a size of the hyperthermal beam; and
a diagnostics chamber and a skimmer aligned with the aperture, wherein the skimmer is configured to focus the hyperthermal beam, wherein the diagnostics chamber comprises a speed selector configured to select a translational energy of the hyperthermal beam, wherein the speed selector comprises one or more rotatable discs configured to allow a portion of the hyperthermal beam to pass through the one or more rotatable discs based on a rotational speed of the one or more rotatable discs and a size of a slit on the one or more rotatable discs, wherein the portion of the hyperthermal beam has the selected translational energy, and wherein the one or more rotatable discs comprise tungsten.

2. The apparatus of claim 1, wherein the plasma discharge source comprises one or more source inlets configured to receive the elemental source, wherein the elemental source comprises one or more of an alkali metal, an alkali earth group metal, hydrogen, or a noble gas.

3. The apparatus of claim 1, wherein the plasma discharge source comprises an anode assembly, wherein the elemental source comprises argon molecules and hydrogen molecules, wherein the plasma discharge source is configured to start receiving the argon molecules before starting to receive the hydrogen molecules, and wherein the one or more neutral atoms comprise neutral hydrogen atoms.

4. The apparatus of claim 1, further comprising a controller, wherein the elemental source comprises a first elemental source and a second elemental source, wherein the plasma discharge source is configured to generate the plasma based on the second elemental source, the first elemental source, or the second elemental source and the first elemental source, wherein a weight of the second elemental source is less than a weight of the first elemental source, wherein the first elemental source comprises a noble gas, and wherein the second elemental source comprises an alkali metal or an alkali earth group metal.

5. The apparatus of claim 1, wherein the plasma discharge source comprises one or more source inlets configured to receive the elemental source, wherein the one or more source inlets are angled substantially tangential to a wall of the plasma discharge source to allow the plasma discharge source to receive the elemental source in a swirl-like distribution.

6. The apparatus of claim 1, wherein the plasma discharge source comprises an anode assembly and a cathode assembly, wherein the anode assembly comprises a nozzle assembly, an anode body and an insulator, wherein the cathode assembly comprises a cathode rod, a cathode body and one or more compression members attached to the cathode rod, wherein the one or more compression members are configured to compress or expand such that the cathode rod is configured to move relative to the anode assembly in a direction parallel to the first direction, wherein a separation distance between the nozzle assembly and a cathode tip of the cathode rod is adjustable based on movement of the cathode rod, wherein the insulator is adjacent to at least a portion of the cathode rod and is configured to electrically insulate the anode assembly from the at least a portion of the cathode rod adjacent to the insulator, wherein the cathode tip is not insulated from the nozzle assembly by the insulator, and wherein the plasma discharge source is further configured to generate a voltage pulse between the nozzle assembly and the cathode tip based on the separation distance.

7. The apparatus of claim 6, wherein the nozzle assembly comprises one or more nozzle holders and a nozzle disc, wherein the one or more nozzle holders are configured to hold the nozzle disc, wherein the one or more nozzle holders comprise copper, brass or stainless steel, wherein the nozzle disc comprises tungsten, wherein the nozzle disc is removable, wherein the anode body comprises copper, brass or stainless steel, wherein the insulator comprises ceramic, wherein the cathode body comprises copper, brass or stainless steel, wherein the cathode rod comprises 2% thoriated tungsten, and wherein the one or more compression members comprise one or more bellows or one or more springs.

8. The apparatus of claim 1, further comprising an intermediary chamber configured to receive the hyperthermal beam, wherein the emission system comprises: a vacuum system configured to pump down a pressure in an interior of the plasma discharge source and a pressure in the intermediary chamber; and one or more source inlets configured to introduce the elemental source into the interior of the plasma discharge source, and
wherein the emission system is configured to provide the pressure in the interior of the plasma discharge source to be higher than the pressure in the intermediary chamber to allow the hyperthermal beam to emit from the plasma discharge source.

9. The apparatus of claim 1, further comprising a controller configured to control a current and a voltage applied to the magnetic source or the plasma discharge source, wherein the magnetic field is tunable based on the current and the voltage, wherein a translational energy of the hyperthermal beam is tunable based on the current and the voltage, wherein an intensity of the hyperthermal beam is tunable based on the current and the voltage, wherein the translation energy is between about 0.5 and 20 eV, and wherein the intensity is on the order of up to about $10^{22}$ atoms/sterad/sec.

10. The apparatus of claim 1, further comprising one or more water-cooling lines and a controller, wherein the one or more water-cooling lines are configured to cool the plasma discharge source and the magnetic source, wherein the one or more water-cooling lines comprise polyethylene tubing, wherein the controller is configured to monitor water flow, gas flow, temperature, or pressure of the apparatus, wherein the controller is further configured to shut down or prevent from turning on the apparatus if a water leak is detected, if a gas leak is detected, if the temperature is beyond a suitable operating temperature range, or if the pressure is beyond a suitable operating pressure range.

11. A method for producing a hyperthermal beam, comprising:
receiving an elemental source;
generating plasma based on the elemental source;
providing a magnetic field;
generating one or more neutral atoms of the elemental source;
emitting a hyperthermal beam, comprising the one or more neutral atoms of the elemental source, collimated in a first direction and having a controlled size;
focusing the hyperthermal beam; and
selecting a translational energy of the hyperthermal beam, wherein a portion of the hyperthermal beam is allowed to pass through one or more rotatable discs based on a rotational speed of the one or more rotatable discs and a size of a slit on the one or more rotatable discs, wherein the portion of the hyperthermal beam has the selected translational energy, and wherein the one or more rotatable discs comprise tungsten.

12. The method of claim 11, wherein the elemental source comprises one or more of an alkali metal, an alkali earth group metal, hydrogen, or a noble gas.

13. The method of claim 11, wherein the elemental source comprises argon molecules and hydrogen molecules, wherein the argon molecules are initially received before starting to receive the hydrogen molecules, and wherein the one or more neutral atoms comprise neutral hydrogen atoms.

14. The method of claim 11, wherein the elemental source comprises a first elemental source and a second elemental source, wherein the generating the plasma comprises generating the plasma based on the second elemental source, the first elemental source, or the second elemental source and the first elemental source, wherein a weight of the second elemental source is less than a weight of the first elemental source, wherein the first elemental source comprises a noble gas, and wherein the second elemental source comprises an alkali metal or an alkali earth group metal.

15. The method of claim 11, wherein the receiving the elemental source comprises receiving the elemental source in a swirl-like distribution.

16. The method of claim 11, further comprising generating a voltage pulse between a nozzle assembly of an anode assembly and a cathode tip of a cathode rod based on a separation distance between the nozzle assembly and the cathode tip, wherein the anode assembly is electrically insulated from at least a portion of the cathode rod.

17. The method of claim 16, wherein the nozzle assembly comprises one or more nozzle holders and a nozzle disc, wherein the method further comprises holding the nozzle disc with the one or more nozzle holders, wherein the one or more nozzle holders comprise copper, brass or stainless steel, wherein the nozzle disc comprises tungsten, wherein the nozzle disc is removable, and wherein the cathode rod comprises 2% thoriated tungsten.

18. The method of claim 11, wherein the receiving comprises receiving the elemental source with a plasma discharge source, and wherein the method further comprises:
receiving the hyperthermal beam with an intermediary chamber;

pumping down a pressure in an interior of the plasma discharge source and a pressure in the intermediary chamber; and providing the pressure in the interior of the plasma discharge source to be higher than the pressure in the intermediary chamber to allow the hyperthermal beam to emit from the plasma discharge source.

19. The method of claim 11, further comprising controlling a current and a voltage applied to a magnetic source or a plasma discharge source, wherein the magnetic field is tunable based on the current and the voltage, wherein a translational energy of the hyperthermal beam is tunable based on the current and the voltage, wherein an intensity of the hyperthermal beam is tunable based on the current and the voltage, wherein the translation energy is between about 0.5 and 20 eV, and wherein the intensity is on the order of up to about $10^{22}$ atoms/sterad/sec.

20. The method of claim 11, further comprising cooling a plasma discharge source and a magnetic source with one or more water-cooling lines, wherein the one or more water-cooling lines comprise polyethylene tubing.

21. An apparatus for producing a hyperthermal beam, comprising:
means for receiving an elemental source;
means for generating plasma based on the elemental source;
means for providing a magnetic field;
means for generating one or more neutral atoms of the elemental source;
means for emitting a hyperthermal beam, comprising the one or more neutral atoms of the elemental source, collimated in a first direction and having a controlled size;
means for focusing the hyperthermal beam; and
means for selecting a translational energy of the hyperthermal beam.

22. The apparatus of claim 21, wherein the means for receiving comprises one or more source inlets, wherein the elemental source comprises one or more of an alkali metal, an alkali earth group metal, hydrogen, or a noble gas.

23. The apparatus of claim 21, further comprising means for controlling at least one of a current and a voltage, wherein the elemental source comprises argon molecules and hydrogen molecules, wherein the means for receiving is configured to start receiving the argon molecules before starting to receive the hydrogen molecules, and wherein the one or more neutral atoms comprise neutral hydrogen atoms.

24. The apparatus of claim 21, further comprising means for pumping down a pressure, wherein the elemental source comprises a first elemental source and a second elemental source, wherein the means for generating the plasma comprises means for generating the plasma based on the second elemental source, the first elemental source, or the second elemental source and the first elemental source, wherein a weight of the second elemental source is less than a weight of the first elemental source, wherein the first elemental source comprises a noble gas, and wherein the second elemental source comprises an alkali metal or an alkali earth group metal.

25. The apparatus of claim 21, wherein the means for receiving the elemental source comprises means for receiving the elemental source in a swirl-like distribution.

26. The apparatus of claim 21, further comprising means for electrically insulating an anode assembly from at least a portion of a cathode rod.

27. The apparatus of claim 21, further comprising:
means for receiving the hyperthermal beam;
means for pumping down a pressure in an interior of the means for receiving the elemental source and a pressure in the means for receiving the hyperthermal beam; and
means for providing the pressure in the interior of the means for receiving the elemental source to be higher than the pressure in the means for receiving the hyperthermal beam to allow the hyperthermal beam to emit from the means for receiving the elemental source.

28. The apparatus of claim 21, further comprising means for controlling a current and a voltage applied to the means for providing the magnetic field or the means for receiving the elemental source, wherein the magnetic field is tunable based on the current and the voltage, wherein a translational energy of the hyperthermal beam is tunable based on the current and the voltage, wherein an intensity of the hyperthermal beam is tunable based on the current and the voltage, wherein the translation energy is between about 0.5 and 20 eV, and herein the intensity is on the order of up to about $10^{22}$ atoms/sterad/sec.

29. The apparatus of claim 21, further comprising:
means for cooling the means for receiving the elemental source and the means for providing the magnetic field;
means for monitoring water flow, gas flow, temperature, or pressure of the apparatus; and
means for shutting down or preventing from turning on the apparatus if a water leak is detected, if a gas leak is detected, if the temperature is beyond a suitable operating temperature range, or if the pressure is beyond a suitable operating pressure range.

* * * * *